US012621947B2

(12) United States Patent
Tang et al.

(10) Patent No.: US 12,621,947 B2
(45) Date of Patent: *May 5, 2026

(54) BACKPLANE ASSEMBLY KIT, RELATED DETACHABLE ASSEMBLY KIT AND RELATED ELECTRONIC DEVICE

(71) Applicant: Moxa Inc., New Taipei City (TW)

(72) Inventors: Chih-Hsiang Tang, New Taipei City (TW); Chun-Jen Shih, New Taipei City (TW)

(73) Assignee: Moxa Inc., New Taipei City (TW)

( * ) Notice: Subject to any disclaimer, the term of this patent is extended or adjusted under 35 U.S.C. 154(b) by 171 days.

This patent is subject to a terminal disclaimer.

(21) Appl. No.: 18/528,803

(22) Filed: Dec. 5, 2023

(65) Prior Publication Data

US 2024/0407122 A1 Dec. 5, 2024

Related U.S. Application Data

(60) Provisional application No. 63/469,551, filed on May 30, 2023.

(51) Int. Cl.
*H05K 7/14* (2006.01)

(52) U.S. Cl.
CPC ......... *H05K 7/1438* (2013.01); *H05K 7/1401* (2013.01)

(58) Field of Classification Search
CPC .................................................. H05K 7/1438

(Continued)

(56) References Cited

U.S. PATENT DOCUMENTS 3,339,954 A 9/1967 Alvden
4,501,460 A 2/1985 Sisler
(Continued)

FOREIGN PATENT DOCUMENTS

CN 105789931 A 7/2016
CN 108141977 A 6/2018
(Continued)

OTHER PUBLICATIONS

Shih, the specification, including the claims, and drawings in the U.S. Appl. No. 18/631,067, filed Apr. 10, 2024.
(Continued)

*Primary Examiner* — Stanley Tso
(74) *Attorney, Agent, or Firm* — Winston Hsu

(57) ABSTRACT

An electronic device is provided and includes a backplane assembly, a detachable assembly and a locking assembly. The detachable assembly is detachably assembled with the backplane assembly. A slot is formed on the detachable assembly. The locking assembly is disposed between the backplane assembly and the detachable assembly for locking the detachable assembly on the backplane assembly. The locking assembly includes a latch component pivotally disposed on the backplane assembly. An end of the latch component is configured to stretch into the detachable assembly through the slot. The end of the latch component engages with the slot for restraining the detachable assembly from being detached from the backplane assembly when the latch component is located at a locking position. Besides, a related backplane assembly kit and a related detachable assembly kit are also provided.

22 Claims, 24 Drawing Sheets

(58) Field of Classification Search
USPC ........................................................ 361/788
See application file for complete search history.

(56) References Cited

U.S. PATENT DOCUMENTS

| | | | |
|---|---|---|---|
| 4,558,914 | A | 12/1985 | Prager |
| 4,648,737 | A | 3/1987 | Lake, Jr. |
| 4,738,632 | A | 4/1988 | Schmidt |
| 5,253,140 | A | 10/1993 | Inoue |
| 5,493,194 | A | 2/1996 | Damiano |
| 5,508,886 | A | 4/1996 | Bernecker |
| 5,677,830 | A | 10/1997 | Nogas |
| 5,737,189 | A | 4/1998 | Kammersgard |
| 6,008,985 | A | 12/1999 | Lake |
| 6,172,875 | B1 | 1/2001 | Suzuki |
| 6,456,495 | B1 | 9/2002 | Wieloch |
| 6,520,605 | B2 | 2/2003 | Nunokawa |
| 6,840,819 | B2 | 1/2005 | Bet |
| 7,021,974 | B2 | 4/2006 | Sichner |
| 7,073,971 | B2 | 7/2006 | Schurr |
| 7,210,586 | B2 | 5/2007 | Ice |
| 7,299,667 | B1 | 11/2007 | Miresmaili |
| 7,374,453 | B1 | 5/2008 | Allcock |
| 8,597,037 | B2 | 12/2013 | Halim |
| 8,628,004 | B2 | 1/2014 | Vazach |
| 9,153,910 | B2 | 10/2015 | Aoki |
| 9,276,349 | B2 | 3/2016 | Yoshida |
| 9,325,110 | B2 | 4/2016 | Lostoski |
| 9,386,718 | B2 | 7/2016 | Kusumi |
| 9,408,321 | B2 | 8/2016 | Nomoto |
| 9,444,231 | B2 | 9/2016 | Ho |
| 9,483,928 | B2 | 11/2016 | Molnar |
| 9,564,707 | B2 | 2/2017 | Geitner |
| 9,865,945 | B2 | 1/2018 | Isobe |
| 9,894,797 | B2 | 2/2018 | Sampath |
| 9,936,598 | B2 | 4/2018 | Gruber |
| 9,966,714 | B1 | 5/2018 | Sreedharan |
| 10,314,194 | B1 | 6/2019 | Chiang |
| 10,483,663 | B2 | 11/2019 | Wrobel |
| 10,716,235 | B1 | 7/2020 | Farnsworth |
| 11,243,504 | B2 | 2/2022 | Wrobel |
| 11,347,195 | B2 | 5/2022 | Kretschmann |
| 11,408,560 | B2 | 8/2022 | Miyake |
| 11,576,275 | B2 | 2/2023 | Huang |
| 11,659,676 | B2 | 5/2023 | Chung |
| 12,245,391 | B2 | 3/2025 | Ke |
| 2001/0046144 | A1 | 11/2001 | Murabayashi |
| 2003/0143896 | A1 | 7/2003 | Bet |
| 2006/0221581 | A1* | 10/2006 | DeNies ............... H05K 7/1461 |
| | | | 361/740 |
| 2009/0244815 | A1 | 10/2009 | Carolls |
| 2010/0200523 | A1 | 8/2010 | Henderson |
| 2015/0015129 | A1 | 1/2015 | Ding |
| 2015/0214657 | A1 | 7/2015 | Geitner |
| 2015/0250312 | A1* | 9/2015 | Barrett .................. E05B 47/023 |
| | | | 312/319.1 |
| 2015/0349452 | A1 | 12/2015 | Yoshida |
| 2018/0020564 | A1 | 1/2018 | Kang |
| 2020/0107464 | A1 | 4/2020 | Lostoski |
| 2022/0256731 | A1 | 8/2022 | Gurlt |
| 2024/0407120 | A1* | 12/2024 | Shih .......................... H05K 7/14 |
| 2024/0407123 | A1* | 12/2024 | Shih .................... H05K 7/1474 |

FOREIGN PATENT DOCUMENTS

| | | | |
|---|---|---|---|
| CN | 109729678 | A | 5/2019 |
| CN | 107305992 | B | 6/2020 |
| CN | 211128561 | U | 7/2020 |
| DE | 6 78 23 090.7 | U1 | 7/1981 |
| EP | 0 661 915 | A1 | 7/1995 |
| EP | 0 599 551 | B1 | 8/1996 |
| EP | 0 896 504 | A2 | 2/1999 |
| EP | 0 944 121 | A1 | 9/1999 |
| EP | 1 595 313 | B1 | 6/2007 |
| JP | 62-98287 | A | 5/1987 |
| JP | 62-98287 | U | 6/1987 |
| JP | 4-19976 | A | 1/1992 |
| JP | 6-216549 | A | 8/1994 |
| JP | 11-103182 | A | 4/1999 |
| JP | 11-168284 | A | 6/1999 |
| JP | 11-274758 | A | 10/1999 |
| JP | 11-284360 | A | 10/1999 |
| JP | 11-354944 | A | 12/1999 |
| JP | 2000-59043 | A | 2/2000 |
| JP | 2001-217016 | A | 8/2001 |
| JP | 2002-231353 | A | 8/2002 |
| JP | 2002-231385 | A | 8/2002 |
| JP | 2003-298251 | A | 10/2003 |
| JP | 2003-298256 | A | 10/2003 |
| JP | 2006-114908 | A | 4/2006 |
| JP | 2010-113444 | A | 5/2010 |
| JP | 2013-74020 | A | 4/2013 |
| JP | 2016-35845 | A | 3/2016 |
| JP | 2016-54266 | A | 4/2016 |
| JP | 6087479 | B1 | 3/2017 |
| JP | 2021-81766 | A | 5/2021 |
| TW | 202119145 | A | 5/2021 |
| WO | 97/35458 | A1 | 9/1997 |
| WO | 2009/140987 | A1 | 11/2009 |
| WO | 2014/016190 | A2 | 1/2014 |

OTHER PUBLICATIONS

Shih, the specification, including the claims, and drawings in the U.S. Appl. No. 18/533,014 , filed Dec. 7, 2023.

* cited by examiner

BACKPLANE ASSEMBLY KIT, RELATED DETACHABLE ASSEMBLY KIT AND RELATED ELECTRONIC DEVICE

CROSS REFERENCE TO RELATED APPLICATIONS

This application claims the benefit of U.S. Provisional Application No. 63/469,551, filed on May 30, 2023. The content of the application is incorporated herein by reference.

BACKGROUND OF THE INVENTION

1. Field of the Invention

The present invention relates to a backplane assembly kit, a related detachable assembly kit and a related electronic device, and more specifically, to a backplane assembly kit, a related detachable assembly kit and a related electronic device with improved modular designs.

2. Description of the Prior Art

Modularity has gradually become a mainstream trend of electronic devices. For example, a remote terminal unit is an electronic device installed at a field location as part of a monitor/control system for monitoring/controlling field devices. The remote terminal unit usually includes multiple modules, which may include a power module, a switch module, a computing module, and an input/output module, and a common backplane for mounting the multiple modules. However, the conventional remote terminal unit lacks of expandability. Besides, the module and the backplane may be disengaged from each other easily due to environmental vibration, i.e., the conventional remote terminal unit is not robust enough to sustain the environmental vibration. Therefore, an improvement is urgently needed.

SUMMARY OF THE INVENTION

It is an objective of the present invention to provide to a backplane assembly kit, a detachable assembly kit and an electronic device with improved modular designs for solving the aforementioned problems.

In order to achieve the aforementioned objective, the present invention discloses a backplane assembly kit. The backplane assembly kit includes a backplane assembly and a latch component. The backplane assembly is configured to allow a detachable assembly to be mounted thereon. The latch component is pivotally disposed on the backplane assembly. At least one end of the latch component is configured to stretch into the detachable assembly through at least one slot formed on the detachable assembly. The at least one end of the latch component engages with the at least one slot for restraining the detachable assembly from being detached from the backplane assembly when the latch component is located at a locking position.

According to an embodiment of the present invention, a pivoting axis of the latch component is different from a height direction.

According to an embodiment of the present invention, the pivoting axis of the latch component is perpendicular to the height direction.

According to an embodiment of the present invention, a cooperating driving structure is formed on the at least one end of the latch component and configured to be abutted for driving the latch component to pivot from the locking position to an unlocking position.

According to an embodiment of the present invention, the backplane assembly includes a front cover and a rear cover. A portion of the latch component is located between the front cover and the rear cover. At least one through hole is formed on the front cover, and the at least one end of the latch component protrudes out of the front cover through the at least one through hole and stretches into the detachable assembly through the at least one slot.

According to an embodiment of the present invention, the latch component is biased to pivot to the locking position by a resilient component.

According to an embodiment of the present invention, the at least one end of the latch component is a hook-shaped structure.

In order to achieve the aforementioned objective, the present invention further discloses a detachable assembly kit. The detachable assembly kit includes a detachable assembly and an operating component. The detachable assembly is configured to be detachably assembled with a backplane assembly. At least one slot is formed on the detachable assembly. The operating component is movably disposed on the detachable assembly and configured to drive a latch component to pivot from a locking position to a unlocking position to disengage at least one end of the latch component from the at least one slot for allowing the detachable assembly to be detached from the backplane assembly.

According to an embodiment of the present invention, the operating component is pivotally disposed on the detachable assembly.

According to an embodiment of the present invention, pivoting axis of the operating component is parallel to a lateral direction and perpendicular to a pivoting axis of the latch component.

According to an embodiment of the present invention, the operating component includes an operating portion and a driving portion, and the operating portion is operated to move the operating component to drive the latch component to pivot from the locking position to the unlocking position by the driving portion.

According to an embodiment of the present invention, a driving structure is formed on the driving portion, and the operating component drives the latch component to pivot from the locking position to the unlocking position by a cooperation of the driving structure and a cooperating driving structure formed on the at least one end of the latch component.

According to an embodiment of the present invention, the operating component is biased to recover by a recovering component.

In order to achieve the aforementioned objective, the present invention further discloses an electronic device. The electronic device includes a backplane assembly, a detachable assembly and a locking assembly. The detachable assembly is detachably assembled with the backplane assembly. At least one slot is formed on the detachable assembly. The locking assembly is disposed between the backplane assembly and the detachable assembly for locking the detachable assembly on the backplane assembly. The locking assembly includes a latch component pivotally disposed on the backplane assembly. At least one end of the latch component is configured to stretch into the detachable assembly through the at least one slot. The at least one end of the latch component engages with the at least one slot for restraining the detachable assembly from being detached from the backplane assembly when the latch component is located at a locking position.

According to an embodiment of the present invention, the locking assembly further includes an operating component movably disposed on the detachable assembly and configured to drive the latch component to pivot from the locking position to a unlocking position to disengage the at least one end of the latch component from the at least one slot for allowing the detachable assembly to be detached from the backplane assembly.

According to an embodiment of the present invention, the operating component is pivotally disposed on the detachable assembly.

According to an embodiment of the present invention, a pivoting axis of the latch component is different from a pivoting axis of the operating component.

According to an embodiment of the present invention, the pivoting axis of the latch component is perpendicular to the pivoting axis of the operating component.

According to an embodiment of the present invention, a driving structure is formed on the driving portion. A cooperating driving structure is formed on the at least one end of the latch component, and the operating component drives the latch component to pivot from the locking position to the unlocking position by a cooperation of the driving structure and the cooperating driving structure.

According to an embodiment of the present invention, the locking assembly further includes a resilient component and a recovering component. The resilient component is configured to drive the latch component to pivot to the locking position, and the recovering component is configured to drive the operating component to recover.

According to an embodiment of the present invention, the locking assembly further includes a resilient component configured to drive the latch component to pivot to the locking position.

In summary, in the present invention, the latch component is configured to pivotally engage with the slot for restraining the detachable assembly from being detached from the backplane assembly when the latch component is located at the locking position. The aforementioned pivotal engaging configuration can effectively restrain the detachable assembly from moving relative to the backplane assembly along the lateral direction, the height direction and a front-rear direction, e.g., an assembling-disassembling direction of the detachable assembly relative to the backplane assembly, so as to prevent unintentional separation of the detachable assembly and the backplane caused by environmental vibration, i.e., the aforementioned configuration can provide a better sustainability of the environmental vibration. Besides, the second module can be assembled with the first module along the lateral direction, which achieves expandability of the electronic device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 23 and FIG. 24 are partial diagrams of a first module of an electronic device at different views according to another embodiment of the present invention.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "left", "right", "front", "back", etc., is used with reference to the orientation of the Figure(s)

being described. The components of the present invention can be positioned in a number of different orientations. As such, the directional terminology is used for purposes of illustration and is in no way limiting. Accordingly, the drawings and descriptions will be regarded as illustrative in nature and not as restrictive. Also, if not specified, the term "couple" is intended to mean either an indirect or direct electrical/mechanical connection. Thus, if a first device is coupled to a second device, that connection may be through a direct electrical/mechanical connection, or through an indirect electrical/mechanical connection via other devices and connections.

Besides, when an ordinal number (such as "first", "second", "third" and so on) is used as an adjective before a term, that ordinal number is used (unless expressly specified otherwise) merely to indicate a particular feature, such as to distinguish that particular feature from another feature that is described by the same term or by a similar term, but that ordinal number does not have any other meaning or limiting effect-it is merely a convenient name. For example, a "first device" may be so named merely to distinguish it from, e.g., a "second device". Thus, the mere usage of the ordinal numbers "first" and "second" before the term "device" does not indicate any other relationship between the two devices, and likewise does not indicate any other characteristics of either or both devices. For example, the mere usage of the ordinal numbers "first" and "second" before the term "device" (1) does not indicate that either device comes before or after any other in order or location; (2) does not indicate that either device occurs or acts before or after any other in time; and (3) does not indicate that either device ranks above or below any other, as in importance or quality. The mere usage of ordinal numbers does not define a numerical limit to the features identified with the ordinal numbers. For example, the mere usage of the ordinal numbers "first" and "second" before the term "device" does not indicate that there are exactly two devices.

Figure 1:
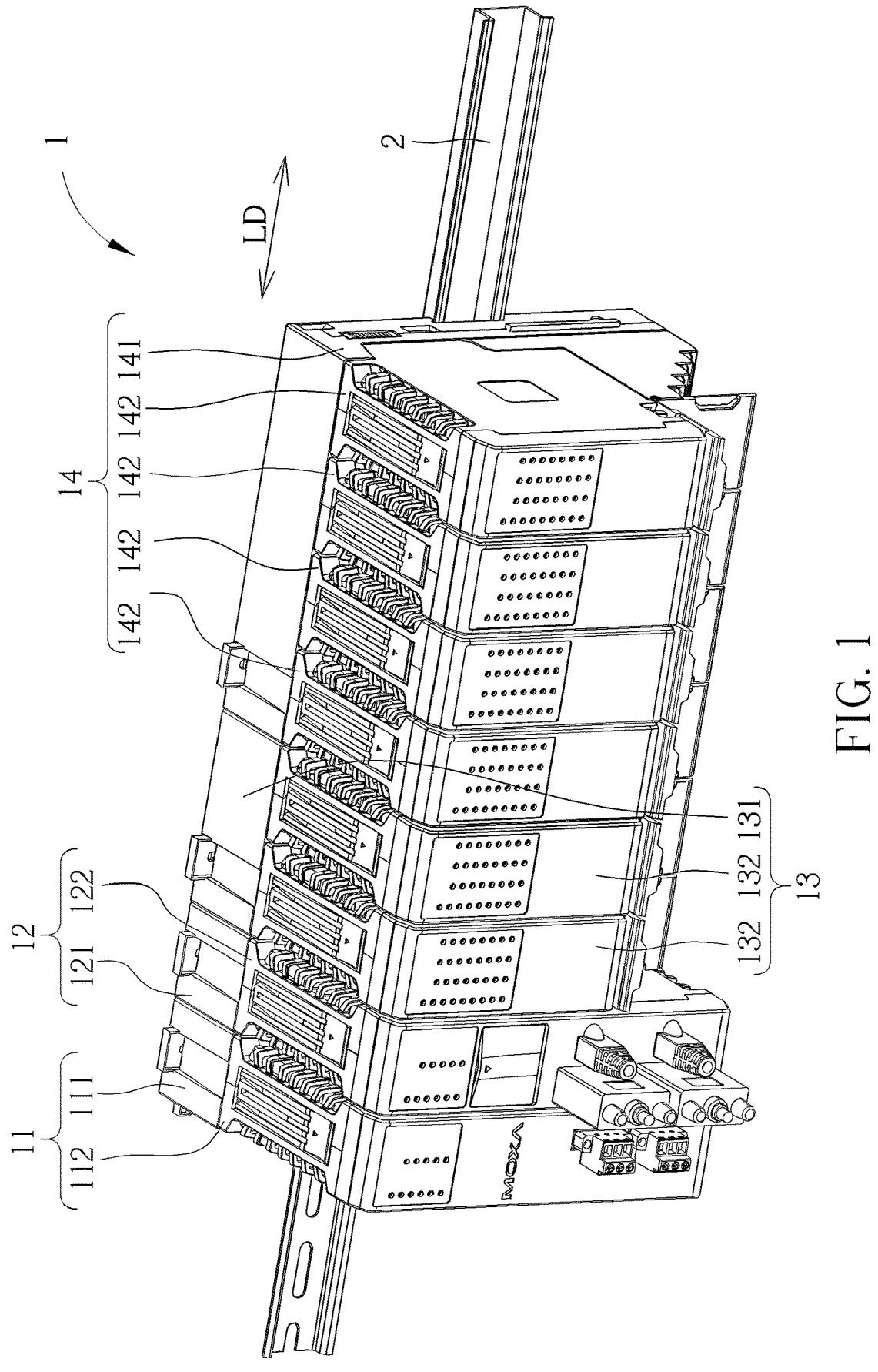
FIG. 1 and FIG. 2 are schematic diagrams of an electronic device at different views according to an embodiment of the present invention.
Figure 2:
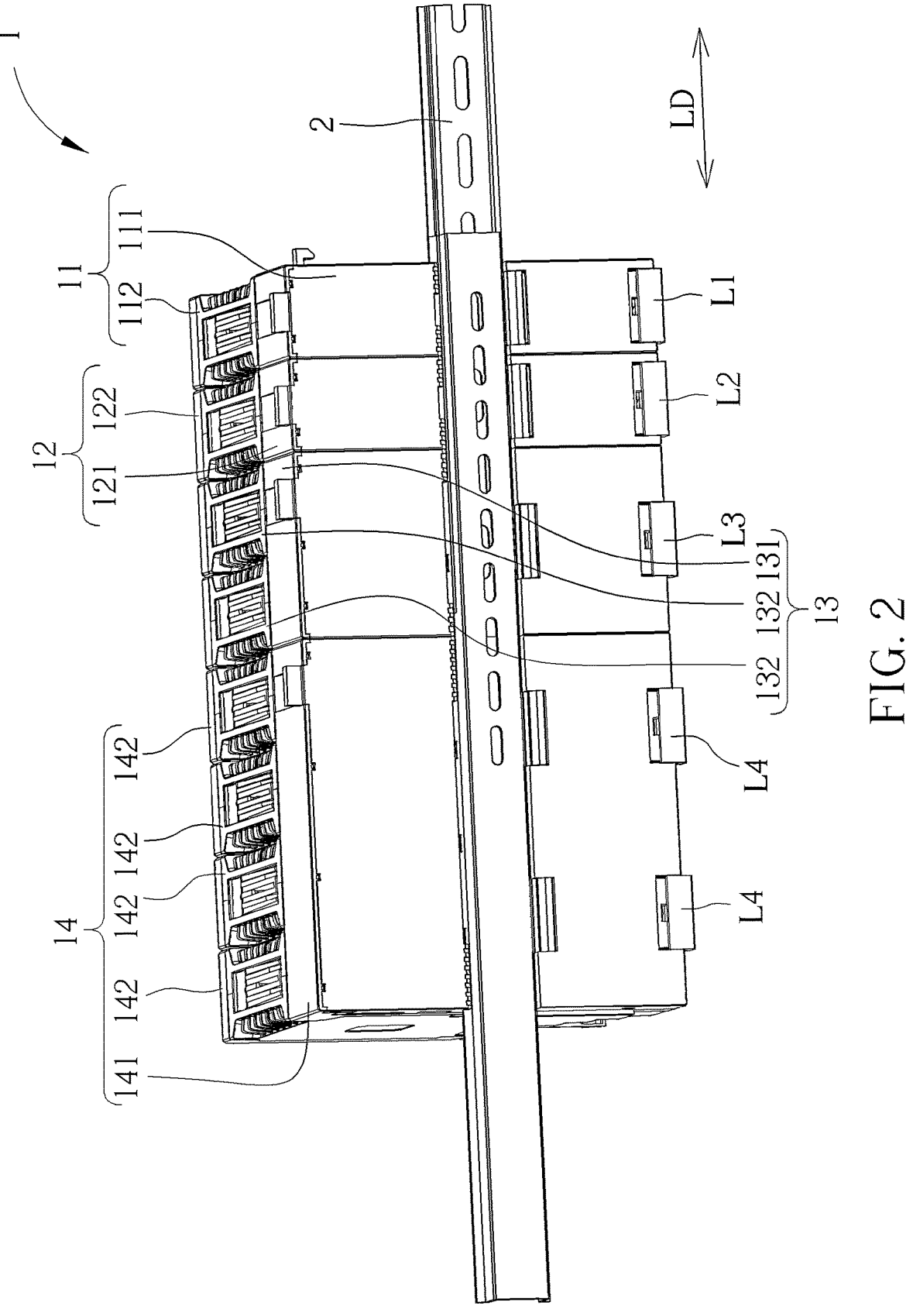
Figure 3:
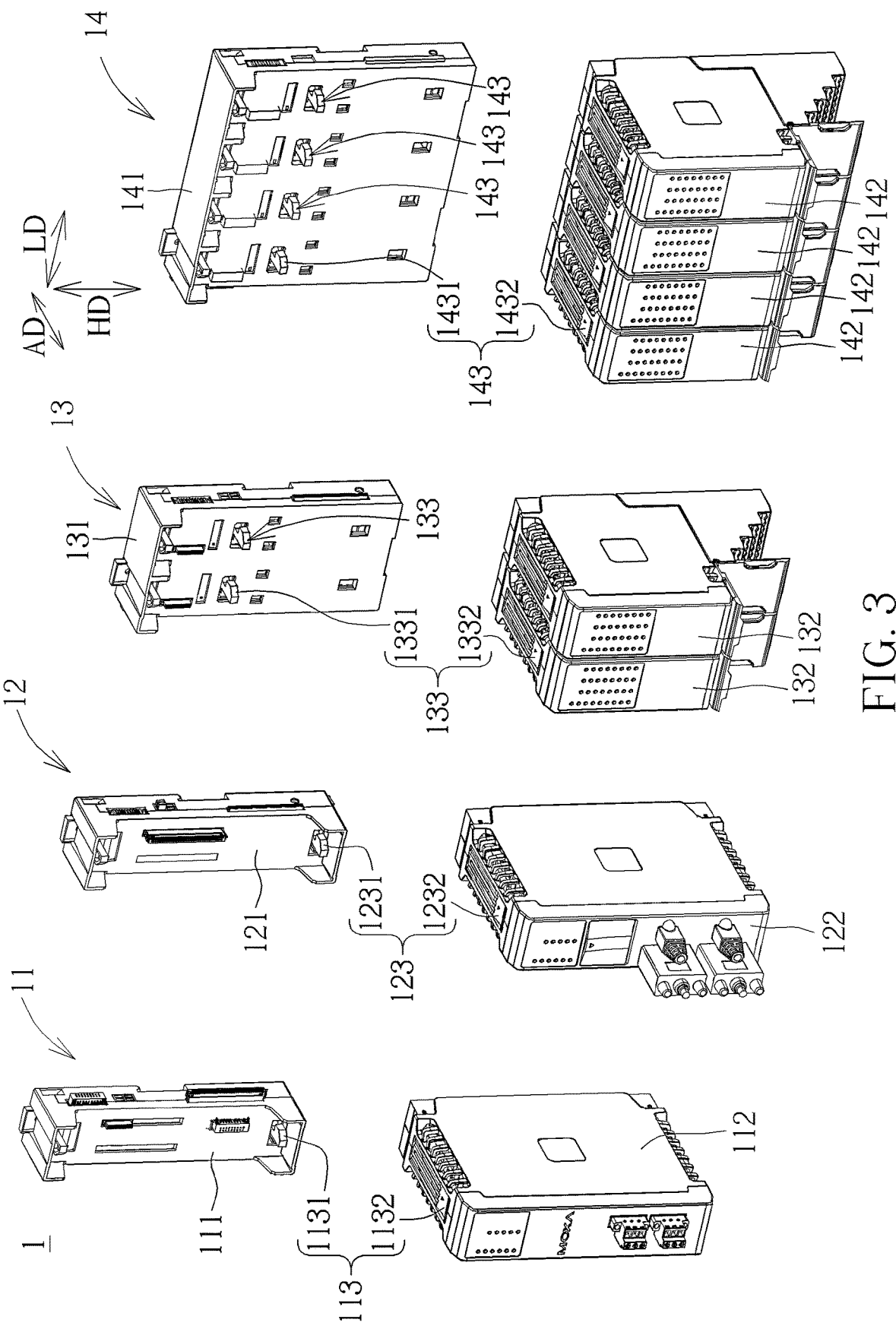
FIG. 3 and FIG. 4 are exploded diagrams of the electronic device at different views according to the embodiment of the present invention.
Figure 4:
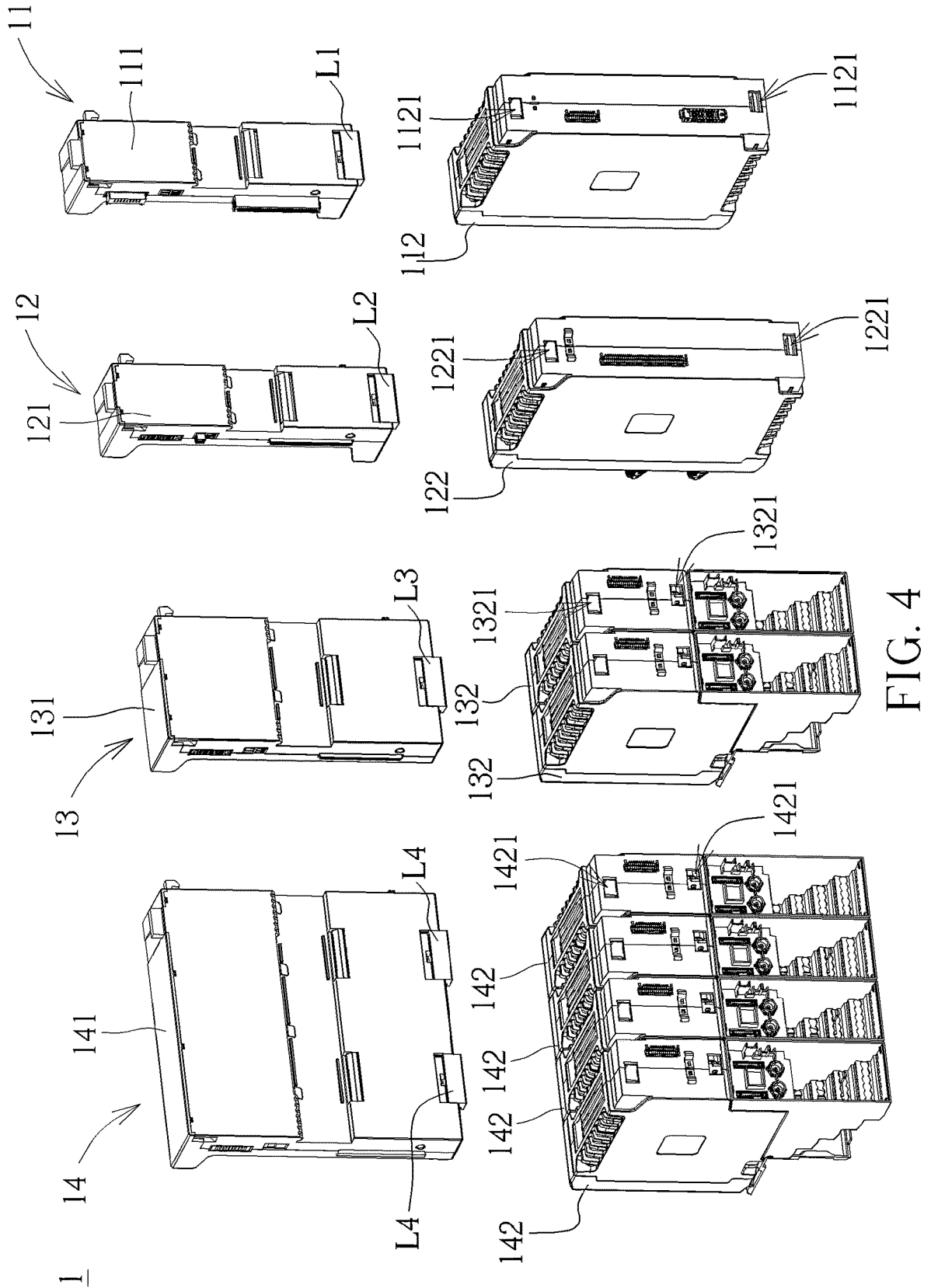

Please refer to FIG. 1 to FIG. 4. FIG. 1 and FIG. 2 are schematic diagrams of an electronic device 1 at different views according to an embodiment of the present invention. FIG. 3 and FIG. 4 are exploded diagrams of the electronic device 1 at different views according to the embodiment of the present invention. As shown in FIG. 1 to FIG. 4, the electronic device 1 can be a remote terminal unit detachably mounted on a rail component 2, e.g., a retractable DIN rail, and the electronic device 1 includes a first module 11, a second module 12, a third module 13 and a fourth module 14. The second module 12 is located between the first module 11 and the third module 13 along a lateral direction LD and electrically and structurally connected to the first module 11 and the third module 13. The third module 13 is located between the second module 12 and the fourth module 14 along the lateral direction LD and electrically and structurally connected to the second module 12 and the fourth module 14. The electronic device 1 is in an expandable configuration. Understandably, in another embodiment, there can be more or fewer modules.

Specifically, the first module 11, the second module 12, the third module 13 and the fourth module 14 can respectively be a power module, a computing module, a first input/output module and a second input/output module. However, the present invention is not limited to this embodiment. For example, in another embodiment, the first module, the second module, the third module and the fourth module can be a power module, a switch module, a computing module and one of the first input/output module and the second input/output module.

As shown in FIG. 3 and FIG. 4, the first module 11 includes a first backplane assembly 111 and a first detachable assembly 112. The first backplane assembly 111 is configured to be detachably installed on the rail component 2, e.g., by a first locking component L1 movably mounted on the first backplane assembly 111. The first detachable assembly 112 is detachably assembled with the first backplane assembly 111. The first module 11 further includes a first locking assembly 113 disposed between the first backplane assembly 111 and the first detachable assembly 112 for locking the first detachable assembly 112 on the first backplane assembly 111 to prevent unintentional separation of the first detachable assembly 112 from the first backplane assembly 111.

Figure 5:
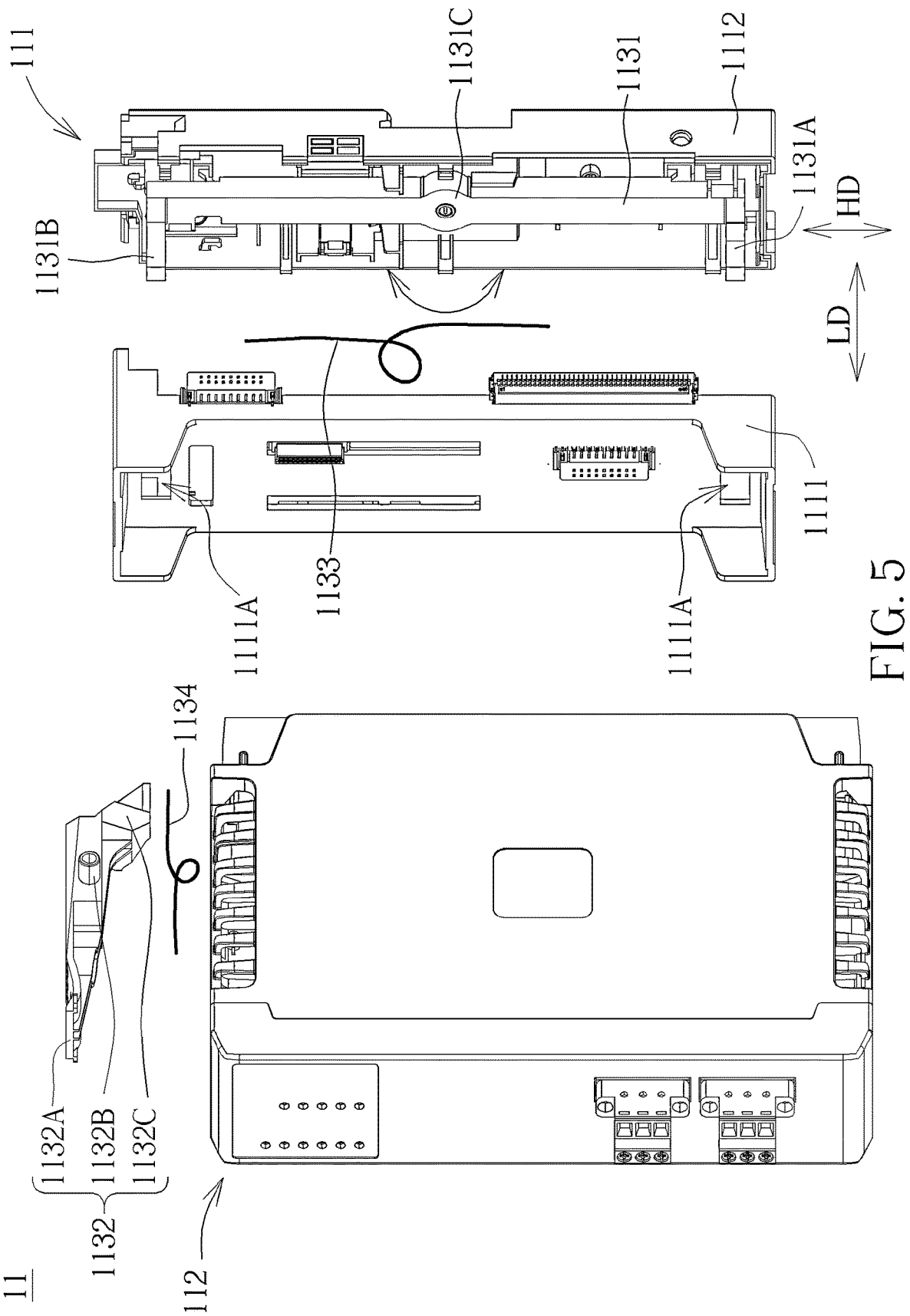
FIG. 5 is an exploded diagram of a first module of the electronic device according to the embodiment of the present invention.
Figure 6:
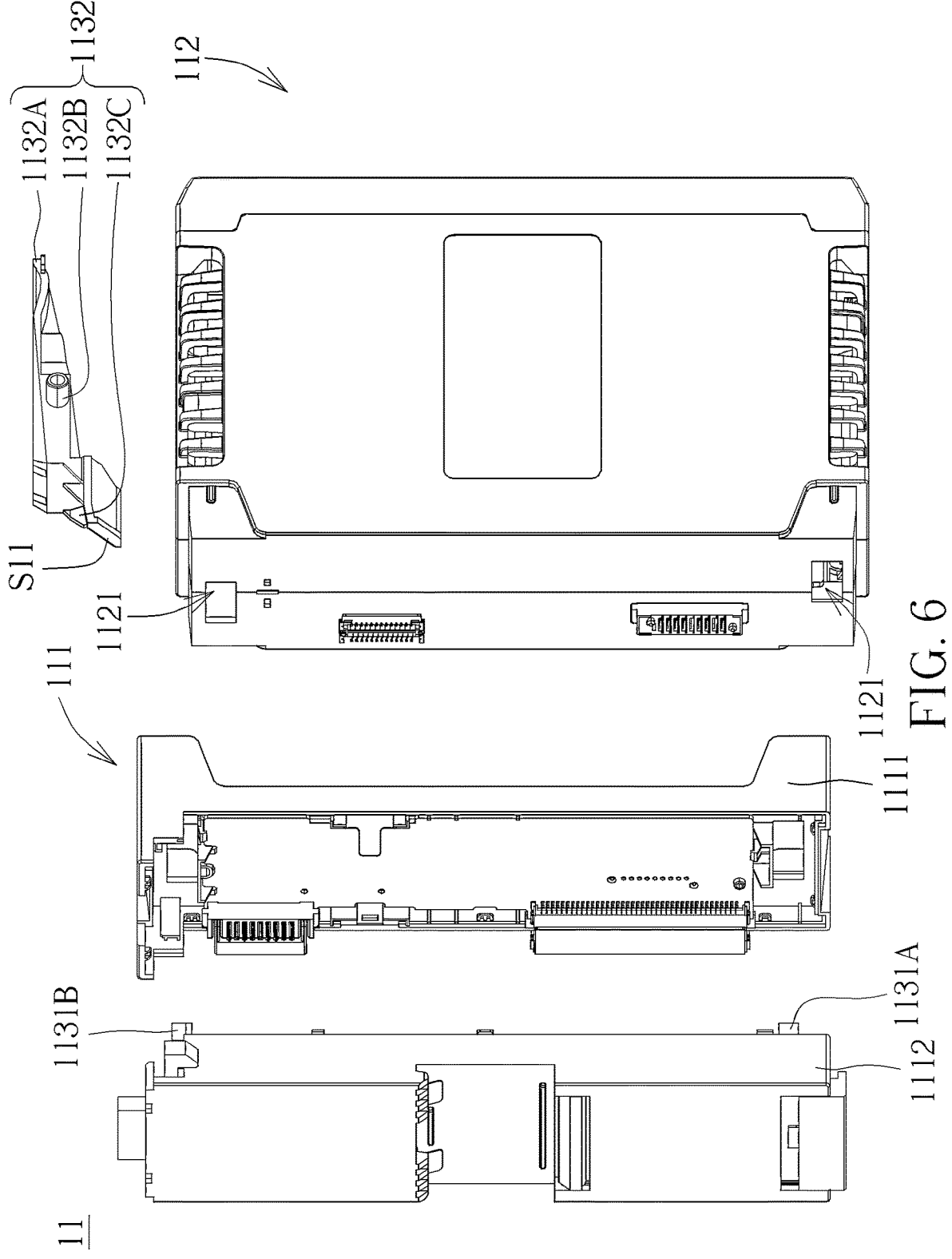
FIG. 6 is a partial exploded diagram of the first module of the electronic device according to the embodiment of the present invention.

Please refer to FIG. 3 to FIG. 6. FIG. 5 is an exploded diagram of the first module 11 of the electronic device 1 according to the embodiment of the present invention. FIG. 6 is a partial exploded diagram of the first module 11 of the electronic device 1 according to the embodiment of the present invention. Specifically, as shown in FIG. 3 to FIG. 6, the first locking assembly 113 includes a first latch component 1131 pivotally disposed on the first backplane assembly 111, and a first operating component 1132 pivotally disposed on the first detachable assembly 112. Two ends 1131A, 1131B of the first latch component 1131 are configured to stretch into the first detachable assembly 112 through two first slots 1121 formed on the first detachable assembly 112 respectively. The first latch component 1131 is pivotally switchable between a first locking position and a first unlocking position along an arrow direction as shown in FIG. 5. A pivoting axis of the first latch component 1131 is different from a pivoting axis of the first operating component 1132. Preferably, the pivoting axis of the first latch component 1131 is substantially perpendicular to the lateral direction LD and a height direction HD, and the pivoting axis of the first operating component 1132 is substantially parallel to the lateral direction LD, i.e., the pivoting axis of the first latch component 1131 is substantially perpendicular to the pivoting axis of the first operating component 1132. When the first latch component 1131 is located at the first locking position, the two ends 1131A, 1131B of the first latch component 1131 respectively engage with the two first slots 1121 for restraining detachment of the first detachable assembly 112 from the first backplane assembly 111. When the first operating component 1132 is operated to drive the first latch component 1131 to move from the first locking position to the first unlocking position, the two ends 1131A, 1131B of the first latch component 1131 respectively disengage from the two first slots 1121 for allowing detachment of the first detachable assembly 112 from the first backplane assembly 111. Preferably, the first latch component 1131 is biased to move to the first locking position by a first resilient component 1133, e.g., a torsional spring, for engaging the two ends 1131A, 1131B of the first latch component 1131 with the two first slots 1121 when the two ends 1131A, 1131B of the first latch component 1131 stretch into the first detachable assembly 112 through the two first slots 1121 respectively. Preferably, the first operating component 1132 is biased to recover by a first recovering component 1134, e.g., a torsional spring, when the first operating component 1132 is released.

More specifically, the first latch component 1131 further includes a pivoting portion 1131C located between the two ends 1131A, 1131B of the first latch component 1131 and pivotally connected to the first backplane assembly 111. The first backplane assembly 111 includes a front cover 1111 and a rear cover 1112. The pivoting portion 1131C of the first latch component 1131 is located between the front cover 1111 and the rear cover 1112 of the first backplane assembly 111. Two through holes 1111A are formed on the front cover 1111, and the two ends 1131A, 1131B of the first latch component 1131 protrude out of the front cover 1111 through the two through holes 1111A and stretch into the first detachable assembly 112 through the two first slots 1121, respectively.

As shown in FIG. 3 to FIG. 6, in this embodiment, the first operating component 1132 includes a first operating portion 1132A, a first connecting portion 1132B and a first driving portion 1132C. The first connecting portion 1132B is located between the first operating portion 1132A and the first driving portion 1132C and pivotally connected to the first detachable assembly 112, and the first operating portion 1132A is operated to pivot the first operating component 1132 to drive the first latch component 1131 to pivot from the first locking position to the first unlocking position by the first driving portion 1132C.

Figure 7:
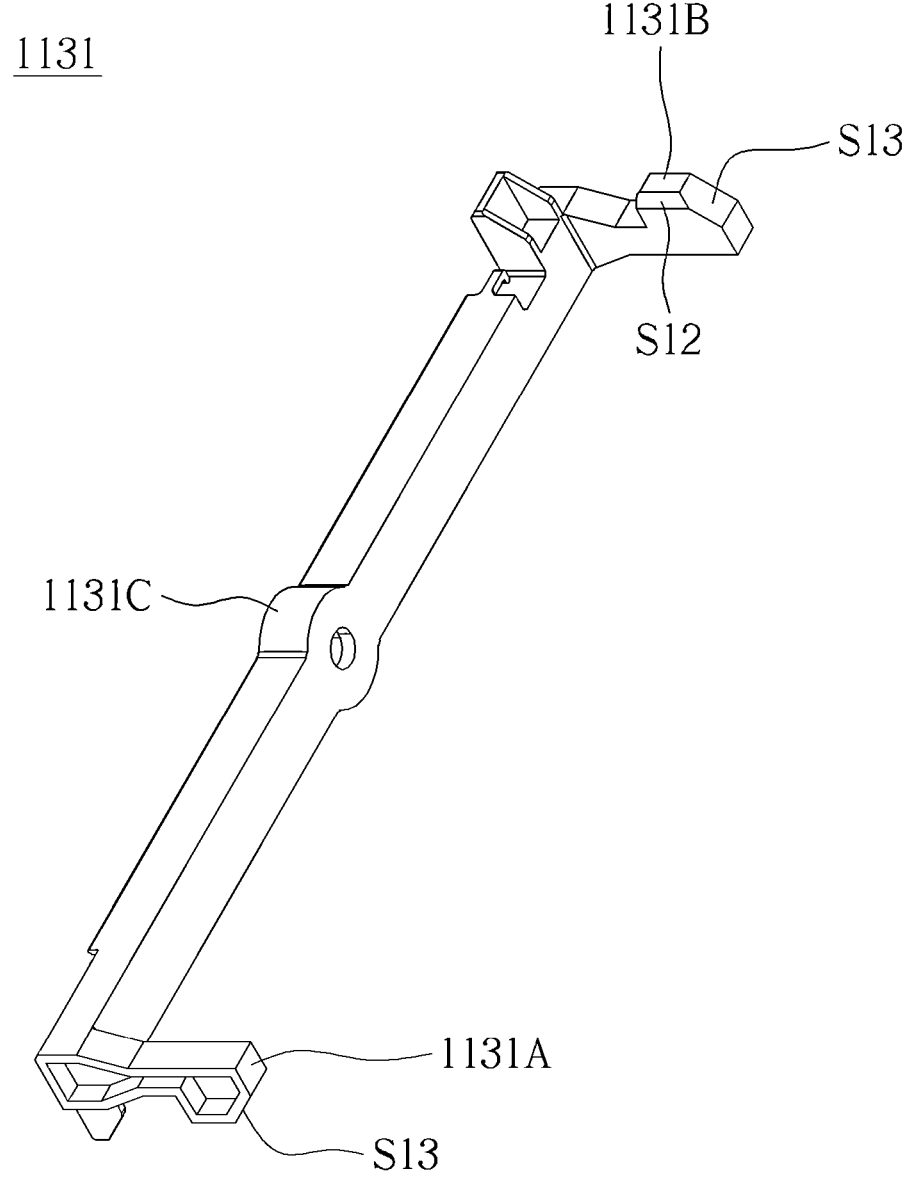
FIG. 7 is a diagram of a first latch component of the electronic device according to the embodiment of the present invention.

Please refer to FIG. 5 to FIG. 7. FIG. 7 is a diagram of the first latch component 1131 of the electronic device 1 according to the embodiment of the present invention. Preferably, as shown in FIG. 5 to FIG. 7, a first driving structure S11 is formed on the first driving portion 1132C. A first cooperating driving structure S12 is formed on the end 1131B of the first latch component 1131 configured to be abutted by the first driving structure S11, and the first operating component 1132 drives the first latch component 1131 to pivot from the first locking position to the first unlocking position by a cooperation of the first driving structure S11 formed on the first driving portion 1132C and the first cooperating driving structure S12 formed on the end 1131B of the first latch component 1131. In this embodiment, the first driving structure S11 and the first cooperating driving structure S12 can be two inclined surfaces. However, the present invention is not limited to this embodiment. A first guiding inclined surface S13 is further formed on each of the two ends 1131A, 1131B of the first latch component 1131 for abutting against a wall of the corresponding first slot 1121 to drive the first latch component 1131 to move away from the first locking position for allowing the two ends 1131A, 1131B of the first latch component 1131 to stretch into the two first slots 1121 respectively.

However, the present invention is not limited to this embodiment. For example, in another embodiment, there can be only one first slot formed on the first detachable assembly, and the first latch component can have only one end for stretching into the first detachably assembly and engaging with the first slot.

As shown in FIG. 1 to FIG. 4, the second module 12 includes a second backplane assembly 121 and a second detachable assembly 122. The second backplane assembly 121 is configured to be detachably installed on the rail component 2, e.g., by a second locking component L2 movably mounted on the second backplane assembly 121. The second detachable assembly 122 is detachably assembled with the second backplane assembly 121. The second module 12 further includes a second locking assembly 123 disposed between the second backplane assembly 121 and the second detachable assembly 122 for locking the second detachable assembly 122 on the second backplane assembly 121 to prevent unintentional separation of the second detachable assembly 122 from the second backplane assembly 121.

Figure 8:
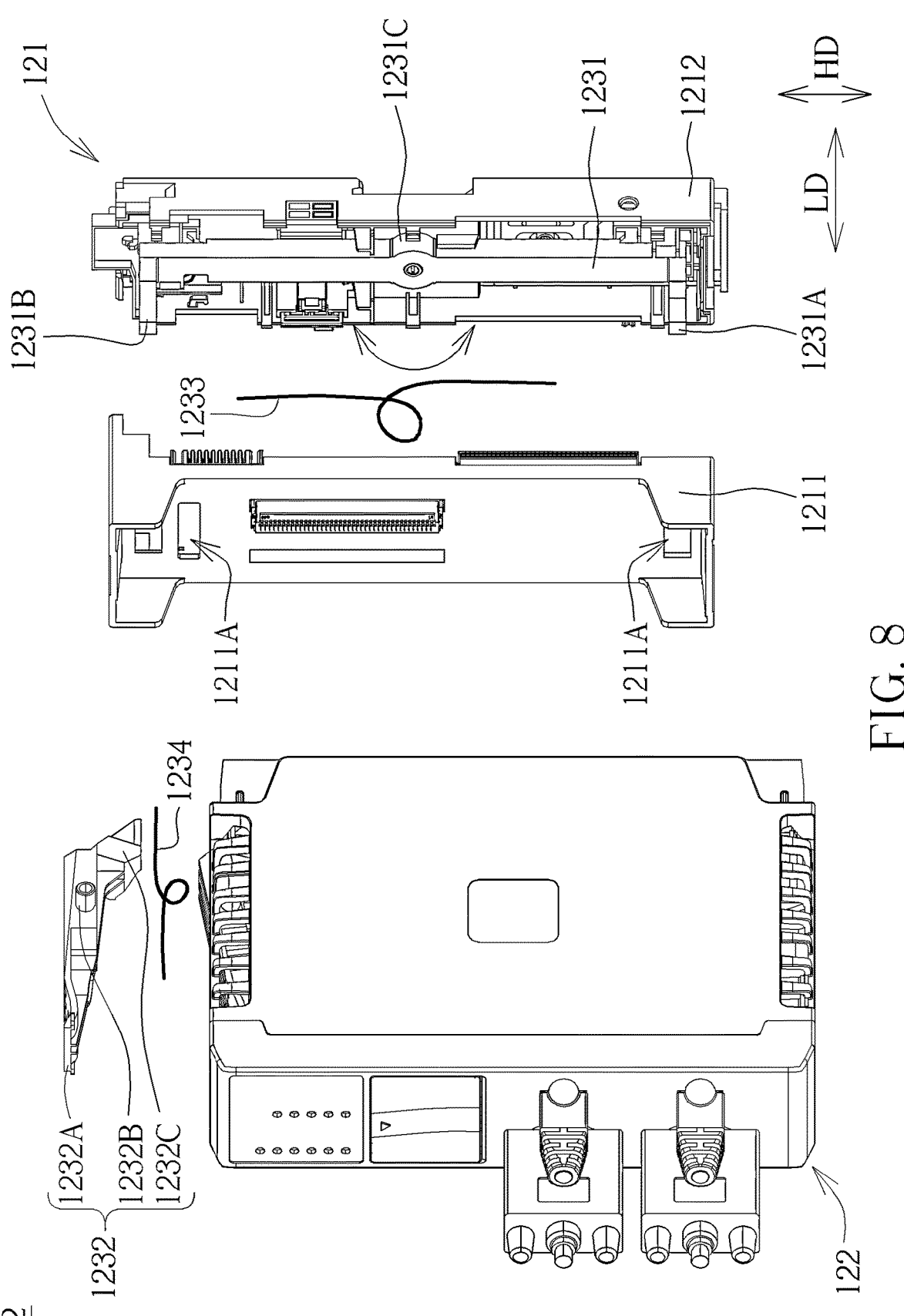
FIG. 8 is an exploded diagram of a second module of the electronic device according to the embodiment of the present invention.
Figure 9:
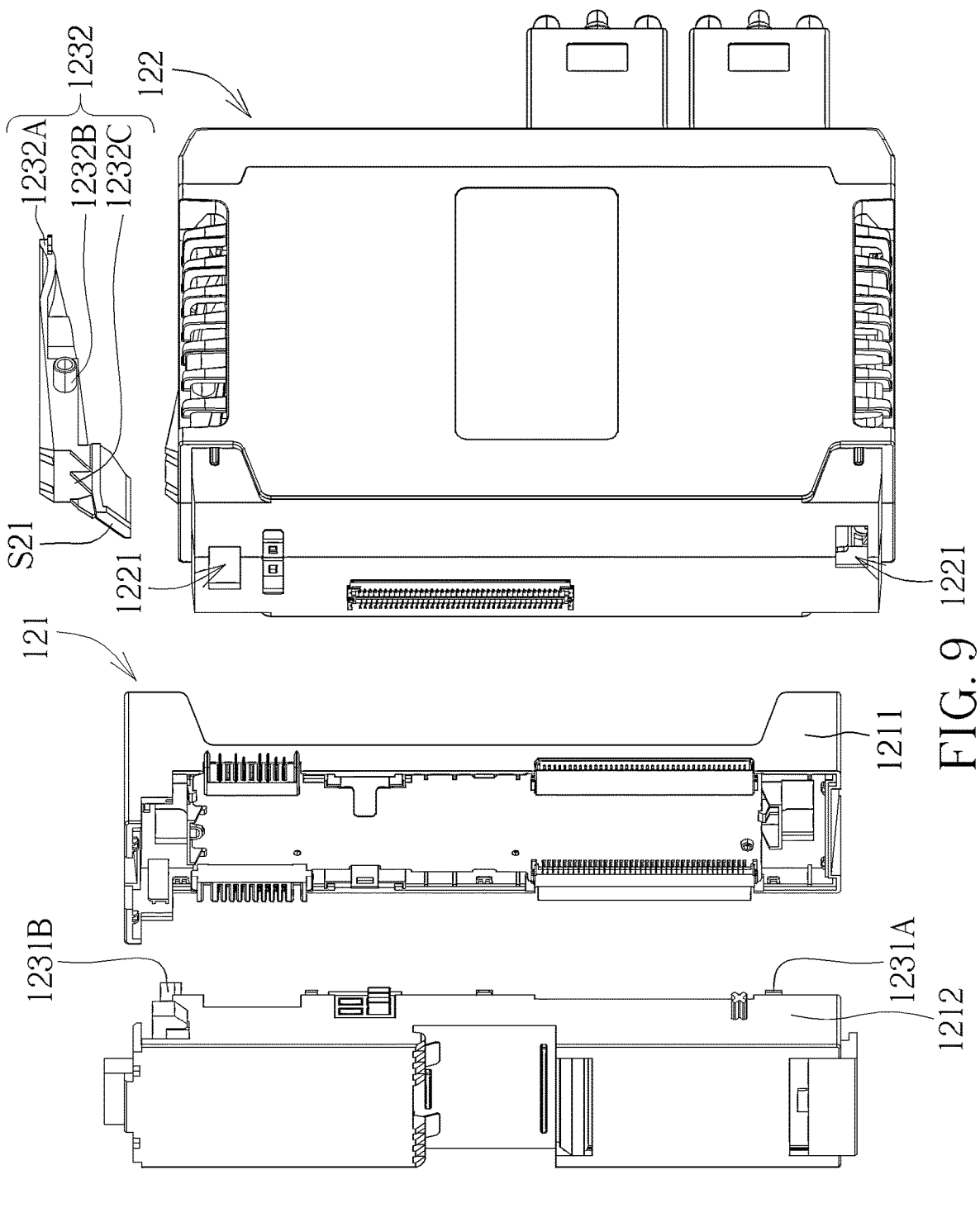
FIG. 9 is a partial exploded diagram of the second module of the electronic device according to the embodiment of the present invention.

Please refer to FIG. 3, FIG. 4, FIG. 8 and FIG. 9. FIG. 8 is an exploded diagram of the second module 12 of the electronic device 1 according to the embodiment of the present invention. FIG. 9 is a partial exploded diagram of the second module 12 of the electronic device 1 according to the embodiment of the present invention. Specifically, as shown in FIG. 3, FIG. 4, FIG. 8 and FIG. 9, the second locking assembly 123 includes a second latch component 1231 pivotally disposed on the second backplane assembly 121 and a second operating component 1232 pivotally disposed on the second detachable assembly 122. Two ends 1231A, 1231B of the second latch component 1231 are configured to stretch into the second detachable assembly 122 through two second slots 1221 formed on the second detachable assembly 122 respectively. The second latch component 1231 is pivotally switchable between a second locking position and a second unlocking position along an arrow direction as shown in FIG. 8. A pivoting axis of the second latch component 1231 is different from a pivoting axis of the second operating component 1232. Preferably, the pivoting axis of the second latch component 1231 is substantially perpendicular to the lateral direction LD and the height direction HD, and the pivoting axis of the second operating component 1232 is substantially parallel to the lateral direction LD, i.e., the pivoting axis of the second latch component 1231 is substantially perpendicular to the pivoting axis of the second operating component 1232. When the second latch component 1231 is located at the second locking position, the two ends 1231A, 1231B of the second latch component 1231 respectively engage with the two second slots 1221 for restraining detachment of the second detachable assembly 122 from the second backplane assembly 121. When the second operating component 1232 is operated to drive the second latch component 1231 to move from the second locking position to the second unlocking position, the two ends 1231A, 1231B of the second latch component 1231 respectively disengage from the two second slots 1221 for allowing detachment of the second detachable assembly 122 from the second backplane assembly 121. Preferably, the second latch component 1231 is biased to move to the second locking position by a second resilient component 1233, e.g., a torsional spring, for engaging the two ends 1231A, 1231B of the second latch component 1231 with the two second slots 1221 when the two ends 1231A, 1231B of the second latch component 1231 stretch into the second detachable assembly 122 through the two second slots 1221 respectively. Preferably, the second operating component 1232 is biased to recover by a second recovering component 1234, e.g., a torsional spring, when the second operating component 1232 is released.

More specifically, the second latch component 1231 further includes a pivoting portion 1231C located between the two ends 1231A, 1231B of the second latch component 1231 and pivotally connected to the second backplane assembly 121. The second backplane assembly 121 includes a front cover 1211 and a rear cover 1212. The pivoting portion 1231C of the second latch component 1231 is located between the front cover 1211 and the rear cover 1212 of the second backplane assembly 121. Two through holes 1211A are formed on the front cover 1211, and the two ends 1231A, 1231B of the second latch component 1231 protrude out of the front cover 1211 through the two through holes 1211A and stretch into the second detachable assembly 122 through the two second slots 1221, respectively.

As shown in FIG. 3, FIG. 4, FIG. 8 and FIG. 9, in this embodiment, the second operating component 1232 includes a second operating portion 1232A, a second connecting portion 1232B and a second driving portion 1232C. The second connecting portion 1232B is located between the second operating portion 1232A and the second driving portion 1232C and pivotally connected to the second detachable assembly 122, and the second operating portion 1232A is operated to pivot the second operating component 1232 to drive the second latch component 1231 to pivot from the second locking position to the second unlocking position by the second driving portion 1232C.

Figure 10:
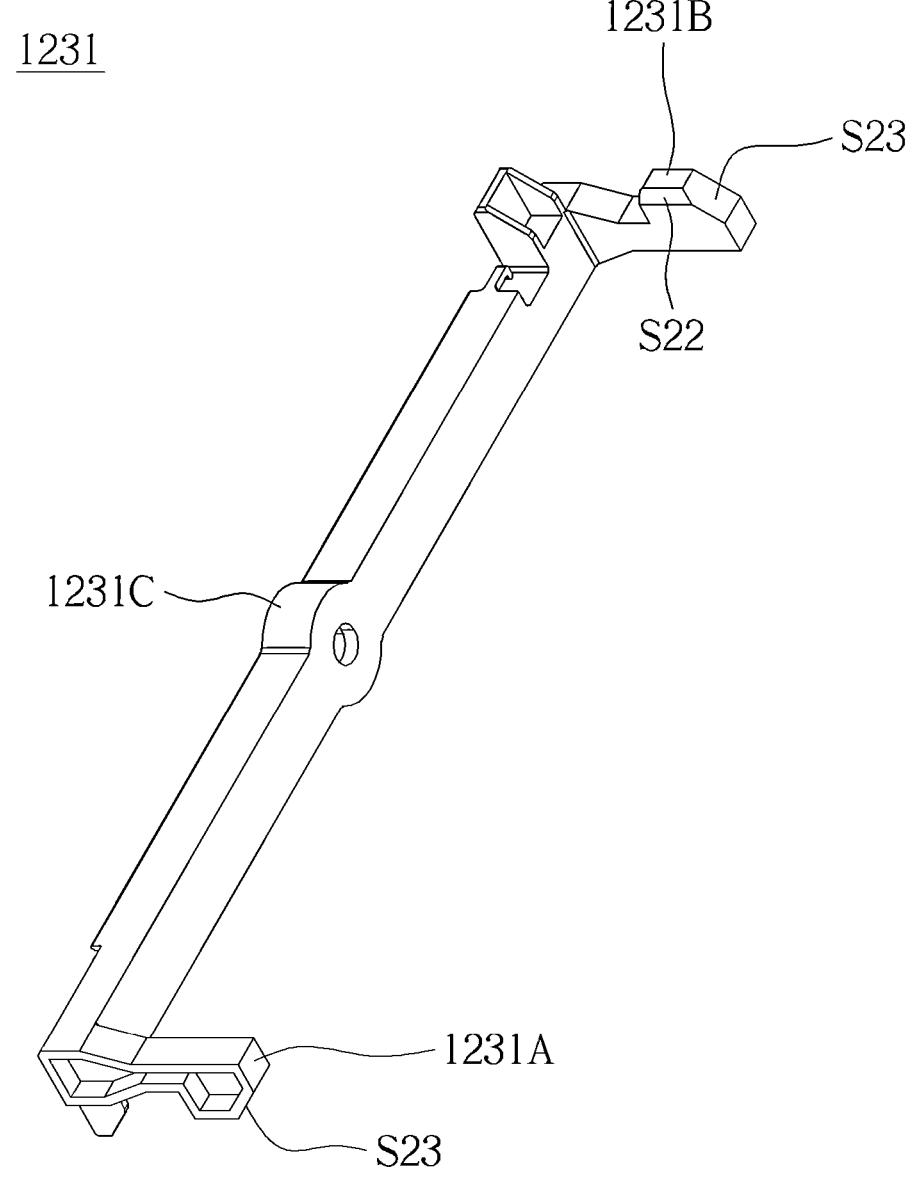
FIG. 10 is a diagram of a second latch component of the electronic device according to the embodiment of the present invention.

Please refer to FIG. 8 to FIG. 10. FIG. 10 is a diagram of the second latch component 1231 of the electronic device 1 according to the embodiment of the present invention. Preferably, as shown in FIG. 8 to FIG. 10, a second driving structure S21 is formed on the second driving portion 1232C. A second cooperating driving structure S22 is formed on the end 1231B of the second latch component 1231 configured to be abutted by the second driving structure S21, and the second operating component 1232 drives the second latch component 1231 to pivot from the second locking position to the second unlocking position by a cooperation of the second driving structure S21 formed on the second driving portion 1232C and the second cooperating driving structure S22 formed on the end 1231B of the second latch component 1231. In this embodiment, the second driving structure S21 and the second cooperating driving structure S22 can be two inclined surfaces. However, the present invention is not limited to this embodiment. A second guiding inclined surface S23 is further formed on each of the two ends 1231A, 1231B of the second latch component 1231 for abutting against a wall of the corresponding second slot 1221 to drive the second latch component 1231 to move away from the second locking position for allowing the two ends 1231A, 1231B of the second latch component 1231 to stretch into the two second slots 1221 respectively.

However, the present invention is not limited to this embodiment. For example, in another embodiment, there can be only one second slot formed on the second detachable assembly, and the second latch component can have only one end for stretching into the second detachably assembly and engaging with the second slot.

As shown in FIG. 1 to FIG. 4, the third module 13 includes a third backplane assembly 131 and two third detachable assemblies 132. The third backplane assembly 131 is configured to be detachably installed on the rail component 2, e.g., by a third locking component L3 movably mounted on the third backplane assembly 131. The two third detachable assemblies 132 are detachably assembled with the third backplane assembly 131 side by side. The third module 13 further includes two third locking assemblies 133. Each of the third locking assemblies 133 is disposed between the third backplane assembly 131 and the corresponding third detachable assembly 132 for locking the corresponding third detachable assembly 132 on the third backplane assembly 131 prevent to unintentional separation of the corresponding third detachable assembly 132 from the third backplane assembly 131.

Figure 11:
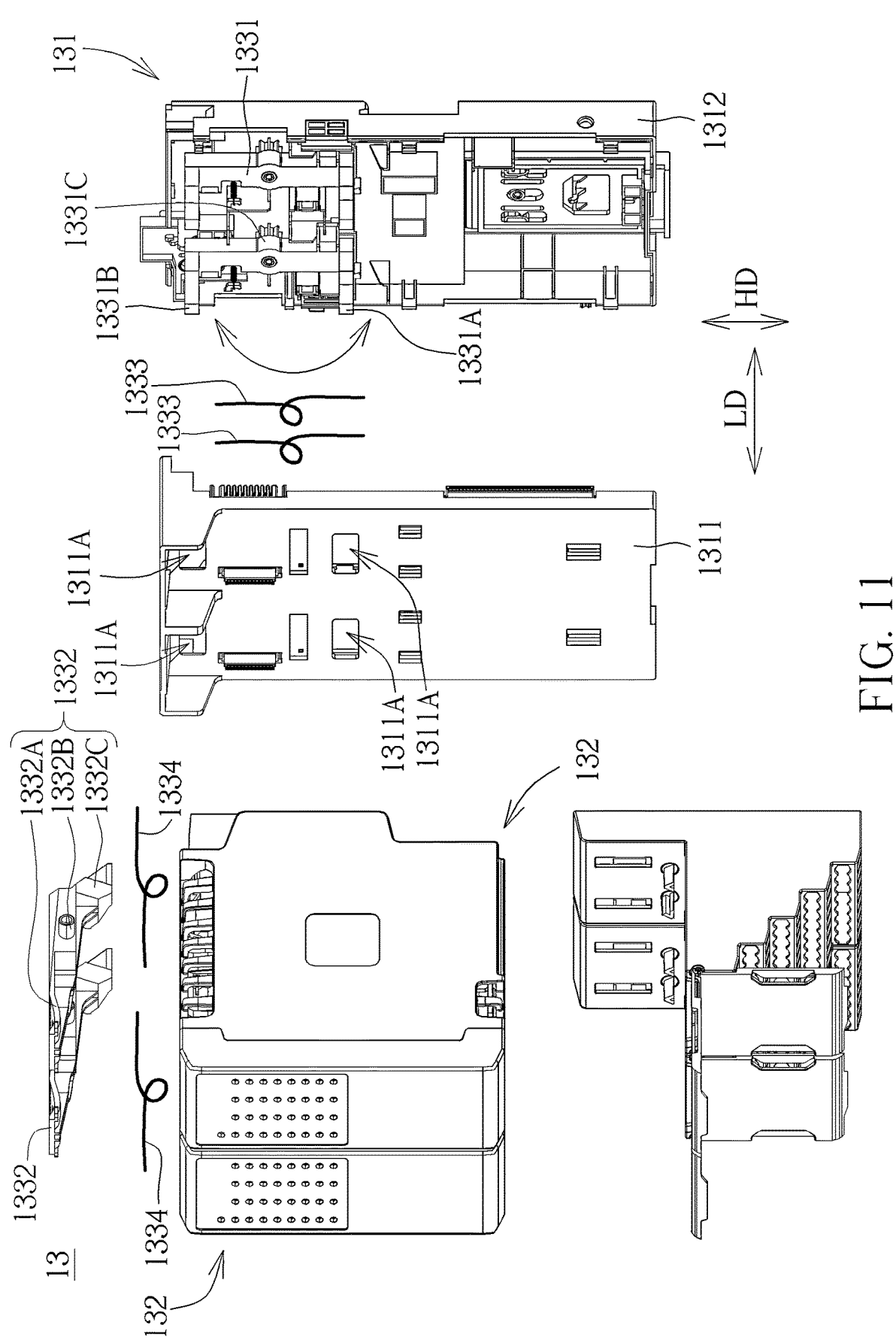
FIG. 11 is an exploded diagram of a third module of the electronic device according to the embodiment of the present invention.
Figure 12:
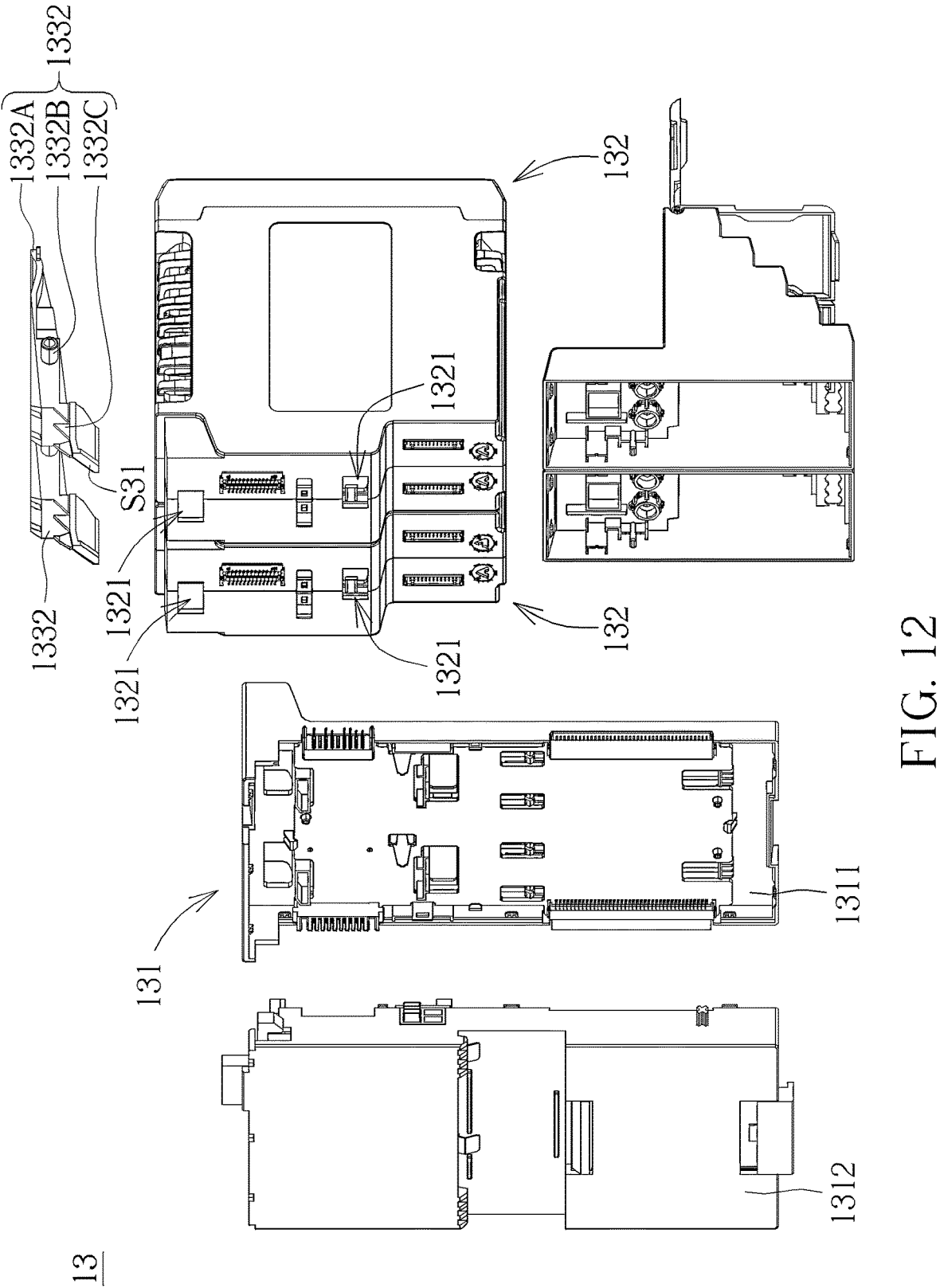
FIG. 12 is a partial exploded diagram of the third module of the electronic device according to the embodiment of the present invention.

Please refer to FIG. 3, FIG. 4, FIG. 11 and FIG. 12. FIG. 11 is an exploded diagram of the third module 13 of the electronic device 1 according to the embodiment of the present invention. FIG. 12 is a partial exploded diagram of the third module 13 of the electronic device 1 according to the embodiment of the present invention. Specifically, as shown in FIG. 3, FIG. 4, FIG. 11 and FIG. 12, each of the third locking assemblies 133 includes a third latch component 1331 pivotally disposed on the third backplane assembly 131 and a third operating component 1332 pivotally disposed on the corresponding third detachable assembly 132. Two ends 1331A, 1331B of each of the third latch components 1331 are configured to stretch into the corresponding third detachable assembly 132 through two third slots 1321 formed on the corresponding third detachable assembly 132 respectively. Each of the third latch components 1331 is pivotally switchable between a third locking position and a third unlocking position along an arrow direction as shown in FIG. 11. A pivoting axis of each of the third latch components 1331 is different from a pivoting axis of the corresponding third operating component 1332. Preferably, the pivoting axis of each of the third latch components 1331 is substantially perpendicular to the lateral direction LD and the height direction HD, and the pivoting axis of each of the third operating components 1332 is substantially parallel to the lateral direction LD, i.e., the pivoting axis of each of the third latch components 1331 is substantially perpendicular to the pivoting axis of the corresponding third operating component 1332. When each of the third latch components 1331 is located at the third locking position, the two ends 1331A, 1331B of each of the third latch components 1331 respectively engage with the two corresponding third slots 1321 for restraining detachment of the corresponding third detachable assembly 132 from the third backplane assembly 131. When each of the third operating components 1332 is operated to drive the corresponding third latch component 1331 to move from the third locking position to the third unlocking position, the two ends 1331A, 1331B of the corresponding third latch component 1331 respectively disengage from the two corresponding third slots 1321 for allowing detachment of the corresponding third detachable assembly 132 from the third backplane assembly 131. Preferably, each of the third latch components 1331 is biased to move to the third locking position by a third resilient component 1333, e.g., a torsional spring, for engaging the two ends 1331A, 1331B of the third latch component 1331 with the two corresponding third slots 1321 when the two ends 1331A, 1331B of the third latch component 1331 stretch into the two third slots 1321 respectively. Preferably, each of the third operating components 1332 is biased to recover by a third recovering component 1334, e.g., a torsional spring, when the third operating component 1332 is released.

More specifically, each of the third latch components 1331 further includes a pivoting portion 1331C located between the two ends 1331A, 1331B of the third latch component 1331 and pivotally connected to the third backplane assembly 131. The third backplane assembly 131 includes a front cover 1311 and a rear cover 1312. The pivoting portion 1331C of each of the third latch components 1331 is located between the front cover 1311 and the rear cover 1312 of the third backplane assembly 131. Four through holes 1311A are formed on the front cover 1311, and the two ends 1331A, 1331B of each of the third latch components 1331 protrude out of the front cover 1311 through the two corresponding through holes 1311A and stretch into the third detachable assembly 132 through the two corresponding third slots 1321, respectively.

As shown in FIG. 3, FIG. 4, FIG. 11 and FIG. 12, in this embodiment, the third operating component 1332 includes a third operating portion 1332A, a third connecting portion 1332B and a third driving portion 1332C. The third connecting portion 1332B is located between the third operating portion 1332A and the third driving portion 1332C and pivotally connected to the third detachable assembly 132, and the third operating portion 1332A is operated to pivot the third operating component 1332 to drive the third latch component 1331 to pivot from the third locking position to the third unlocking position by the third driving portion 1332C.

Figure 13:
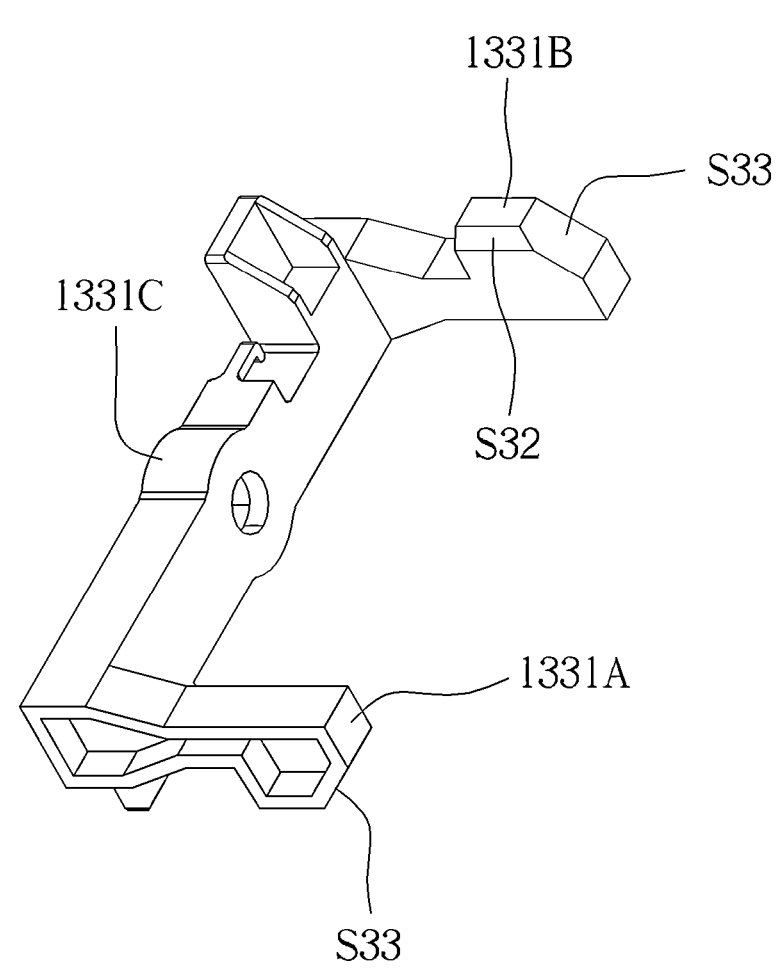
FIG. 13 is a diagram of a third latch component of the electronic device according to the embodiment of the present invention.

Please refer to FIG. 11 to FIG. 13. FIG. 13 is a diagram of the third latch component 1331 of the electronic device 1 according to the embodiment of the present invention. Preferably, as shown in FIG. 11 to FIG. 13, a third driving structure S31 is formed on the third driving portion 1332C. A third cooperating driving structure S32 is formed on the end 1331B of the third latch component 1331 configured to be abutted by the third driving structure S31, and the third operating component 1332 drives the third latch component 1331 to pivot from the third locking position to the third unlocking position by a cooperation of the third driving structure S31 formed on the third driving portion 1332C and the third cooperating driving structure S32 formed on the end 1331B of the third latch component 1331. In this embodiment, the third driving structure S31 and the third cooperating driving structure S32 can be two inclined surfaces. However, the present invention is not limited to this embodiment. A third guiding inclined surface S33 is further formed on each of the two ends 1331A, 1331B of the third latch component 1331 for abutting against a wall of the corresponding third slot 1321 to drive the third latch component 1331 to move away from the third locking position for allowing the two ends 1331A, 1331B of the third latch component 1331 to stretch into the two third slots 1321 respectively.

However, the present invention is not limited to this embodiment. For example, in another embodiment, there can be only one third slot formed on the third detachable assembly, and the third latch component can have only one end for stretching into the third detachably assembly and engaging with the third slot.

As shown in FIG. 1 to FIG. 4, the fourth module 14 includes a fourth backplane assembly 141 and four fourth detachable assemblies 142. The fourth backplane assembly 141 is configured to be detachably installed on the rail component 2, e.g., by two fourth locking components L4 movably mounted on the fourth backplane assembly 141. The fourth detachable assemblies 142 are detachably assembled with the fourth backplane assembly 141 side by side. The fourth module 14 further includes four fourth locking assemblies 143. Each of the fourth locking assemblies 143 is disposed between the fourth backplane assembly 141 and the corresponding fourth detachable assembly 142 for locking the corresponding fourth detachable assembly 142 on the fourth backplane assembly 141 to prevent unintentional separation of the corresponding fourth detachable assembly 142 from the fourth backplane assembly 141.

Figure 14:
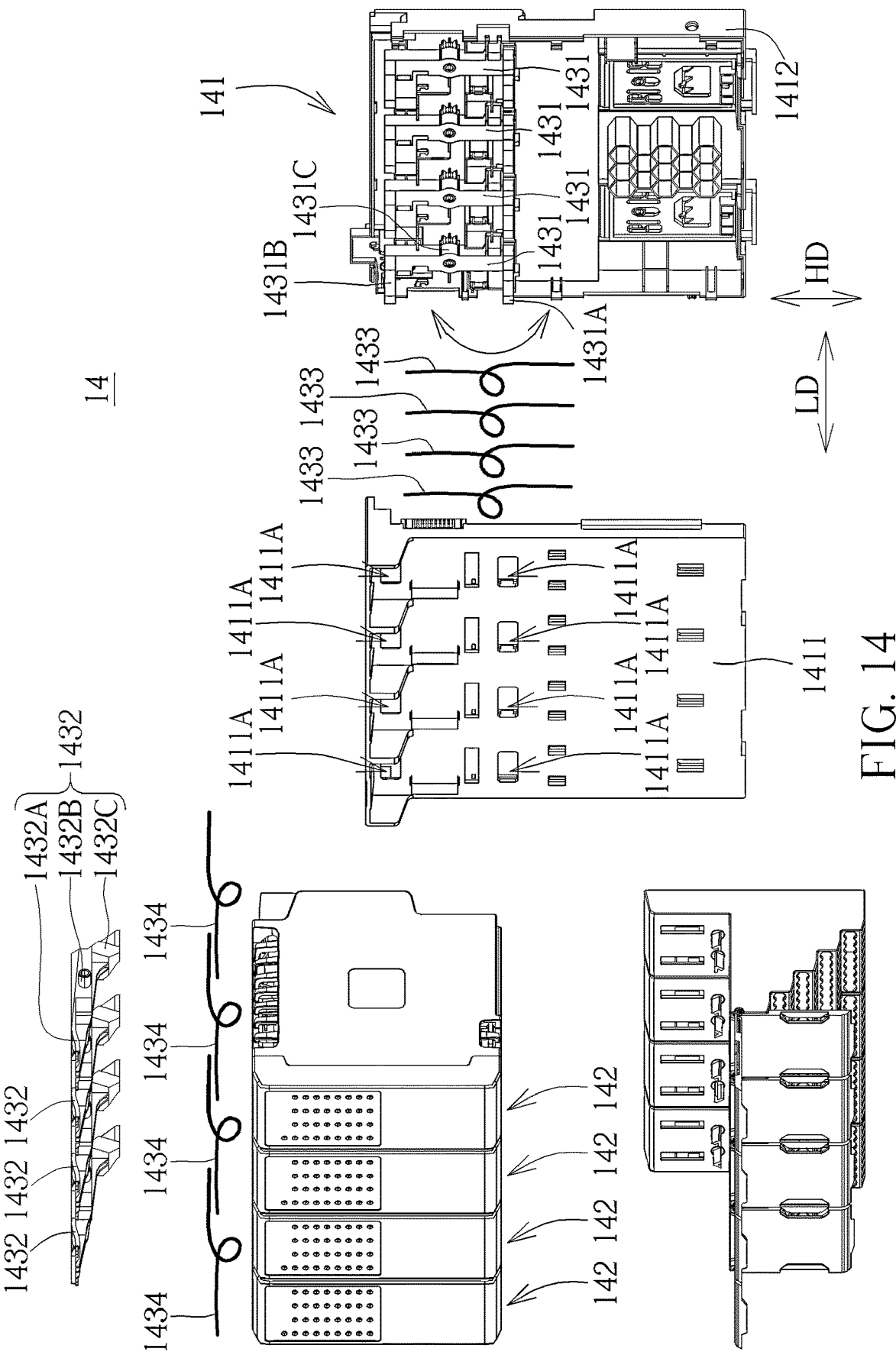
FIG. 14 is an exploded diagram of a fourth module of the electronic device according to the embodiment of the present invention.
Figure 15:
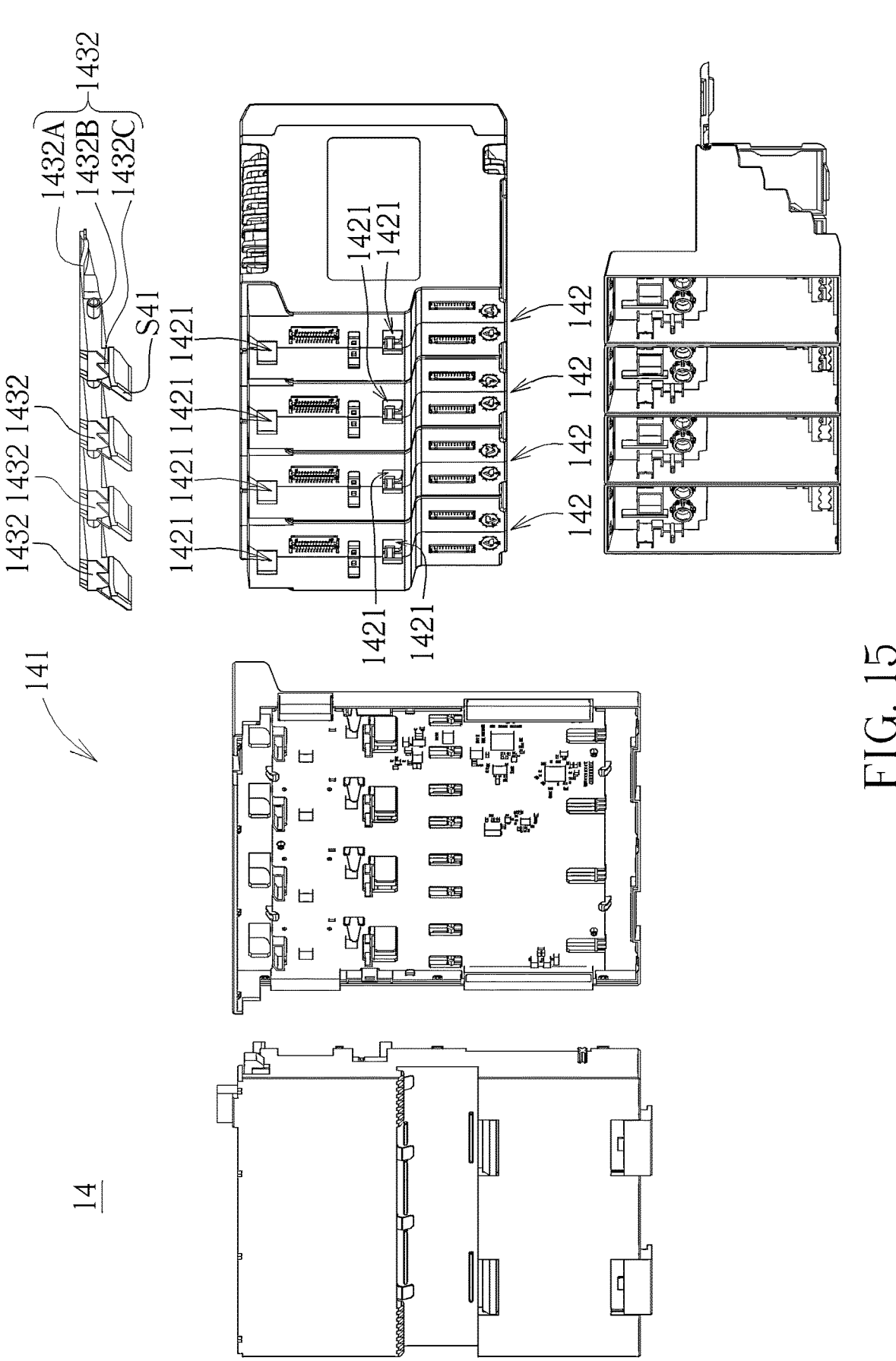
FIG. 15 is a partial exploded diagram of the fourth module of the electronic device according to the embodiment of the present invention.

Please refer to FIG. 3, FIG. 4, FIG. 14 and FIG. 15. FIG. 14 is an exploded diagram of the fourth module 14 of the electronic device 1 according to the embodiment of the present invention. FIG. 15 is a partial exploded diagram of the fourth module 14 of the electronic device 1 according to the embodiment of the present invention. Specifically, as shown in FIG. 3, FIG. 4, FIG. 14 and FIG. 15, each of the fourth locking assemblies 143 includes a fourth latch component 1431 pivotally disposed on the fourth backplane assembly 141 and a fourth operating component 1432 pivotally disposed on the corresponding fourth detachable assembly 142. Two ends 1431A, 1431B of each of the fourth latch components 1431 are configured to stretch into the corresponding fourth detachable assembly 142 through two fourth slots 1421 formed on the corresponding fourth detachable assembly 142 respectively. Each of the fourth latch components 1431 is pivotally switchable between a fourth locking position and a fourth unlocking position along an arrow direction as shown in FIG. 14. A pivoting axis of each of the fourth latch components 1431 is different from a pivoting axis of the corresponding fourth operating component 1432. Preferably, the pivoting axis of each of the fourth latch components 1431 is substantially perpendicular to the lateral direction LD and the height direction HD, and the pivoting axis of each of the fourth operating components 1432 is substantially parallel to the lateral direction LD, i.e., the pivoting axis of each of the fourth latch components 1431 is substantially perpendicular to the pivoting axis of the corresponding fourth operating component 1432. When each of the fourth latch components 1431 is located at the fourth locking position, the two ends 1431A, 1431B of each of the fourth latch components 1431 respectively engage with the two corresponding fourth slots 1421 for restraining detachment of the corresponding fourth detachable assembly 142 from the fourth backplane assembly 141. When each of the fourth operating components 1432 is operated to drive the corresponding fourth latch component 1431 to move from the fourth locking position to the fourth unlocking position, the two ends 1431A, 1431B of each of the fourth latch components 1431 respectively disengage from the two corresponding fourth slots 1421 for allowing detachment of the corresponding fourth detachable assembly 142 from the fourth backplane assembly 141. Preferably, each of the fourth latch components 1431 is biased to move to the fourth locking position by a fourth resilient component 1433, e.g., a torsional spring, for engaging the two ends 1431A, 1431B of the fourth latch component 1431 with the two corresponding fourth slots 1421 when the two ends 1431A, 1431B of the fourth latch component 1431 stretch into the corresponding fourth detachable assembly 142 through the two fourth slots 1421 respectively. Preferably, each of the fourth operating components 1432 is biased to recover by a fourth recovering component 1434, e.g., a torsional spring, when the fourth operating component 1432 is released.

More specifically, each of the fourth latch components 1431 further includes a pivoting portion 1431C located between the two ends 1431A, 1431B of the fourth latch component 1431 and pivotally connected to the fourth backplane assembly 141. The fourth backplane assembly 141 includes a front cover 1411 and a rear cover 1412. The pivoting portion 1431C of each of the fourth latch components 1431 is located between the front cover 1411 and the rear cover 1412 of the fourth backplane assembly 141. Eight through holes 1411A are formed on the front cover 1411, and the two ends 1431A, 1431B of each of the four fourth latch components 1431 protrude out of the front cover 1411 through the corresponding two through holes 1411A and stretch into the fourth detachable assembly 142 through the two corresponding fourth slots 1321, respectively.

As shown in FIG. 3, FIG. 4, FIG. 14 and FIG. 15, in this embodiment, the fourth operating component 1432 includes a fourth operating portion 1432A, a fourth connecting portion 1432B and a fourth driving portion 1432C. The fourth connecting portion 1432B is located between the fourth operating portion 1432A and the fourth driving portion 1432C and pivotally connected to the fourth detachable assembly 142, and the fourth operating portion 1432A is operated to pivot the fourth operating component 1432 to drive the fourth latch component 1431 to pivot from the fourth locking position to the fourth unlocking position by the fourth driving portion 1432C.

Figure 16:
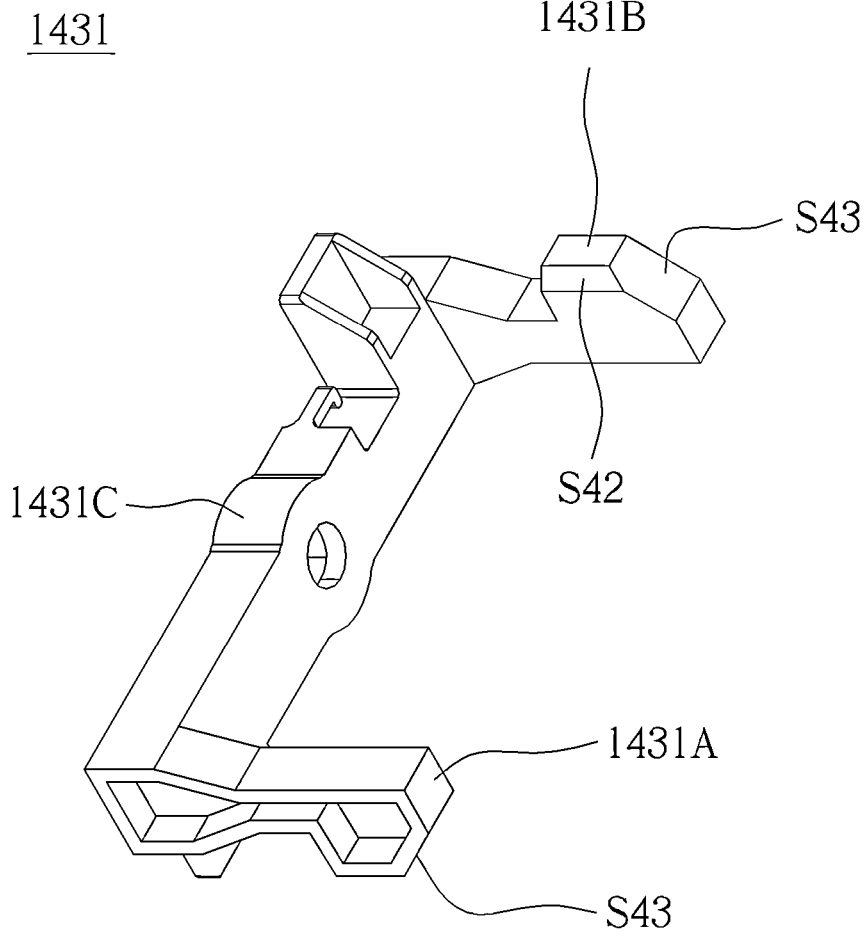
FIG. 16 is a diagram of a fourth latch component of the electronic device according to the embodiment of the present invention.

Please refer to FIG. 14 to FIG. 16. FIG. 16 is a diagram of the fourth latch component 1431 of the electronic device 1 according to the embodiment of the present invention. Preferably, as shown in FIG. 14 to FIG. 16, a fourth driving structure S41 is formed on the fourth driving portion 1432C. A fourth cooperating driving structure S42 is formed on the end 1431B of the fourth latch component 1431 configured to be abutted by the fourth driving structure S41, and the fourth operating component 1432 drives the fourth latch component 1431 to pivot from the fourth locking position to the fourth unlocking position by a cooperation of the fourth driving structure S41 formed on the fourth driving portion 1432C and the fourth cooperating driving structure S42 formed on the end 1431B of the fourth latch component 1431. In this embodiment, the fourth driving structure S41 and the fourth cooperating driving structure S42 can be two inclined surfaces. However, the present invention is not limited to this embodiment. A fourth guiding inclined surface S43 is further formed on each of the two ends 1431A, 1431B of the fourth latch component 1431 for abutting against a wall of the corresponding fourth slot 1421 to drive the fourth latch component 1431 to move away from the fourth locking position for allowing the two ends 1431A, 1431B of the fourth latch component 1431 to stretch into the two fourth slots 1421 respectively.

However, the present invention is not limited to this embodiment. For example, in another embodiment, there can be only one fourth slot formed on the fourth detachable assembly, and the fourth latch component can have only one end for stretching into the fourth detachably assembly and engaging with the fourth slot.

Figure 17:
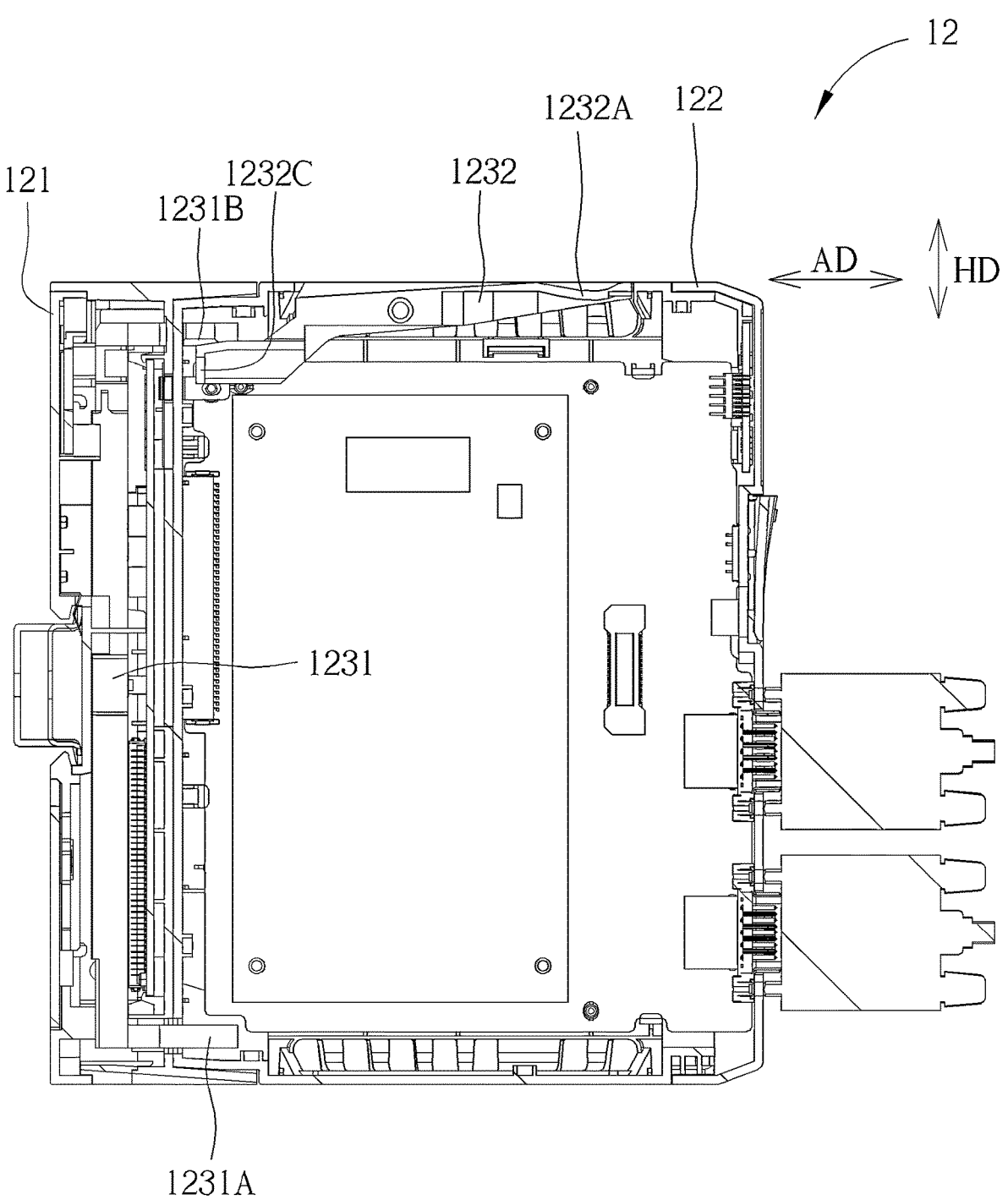
FIG. 17 and FIG. 18 are partial diagrams of the second module of the electronic device at different views as the second latch component is located at a second locking position according to the embodiment of the present invention.
Figure 18:
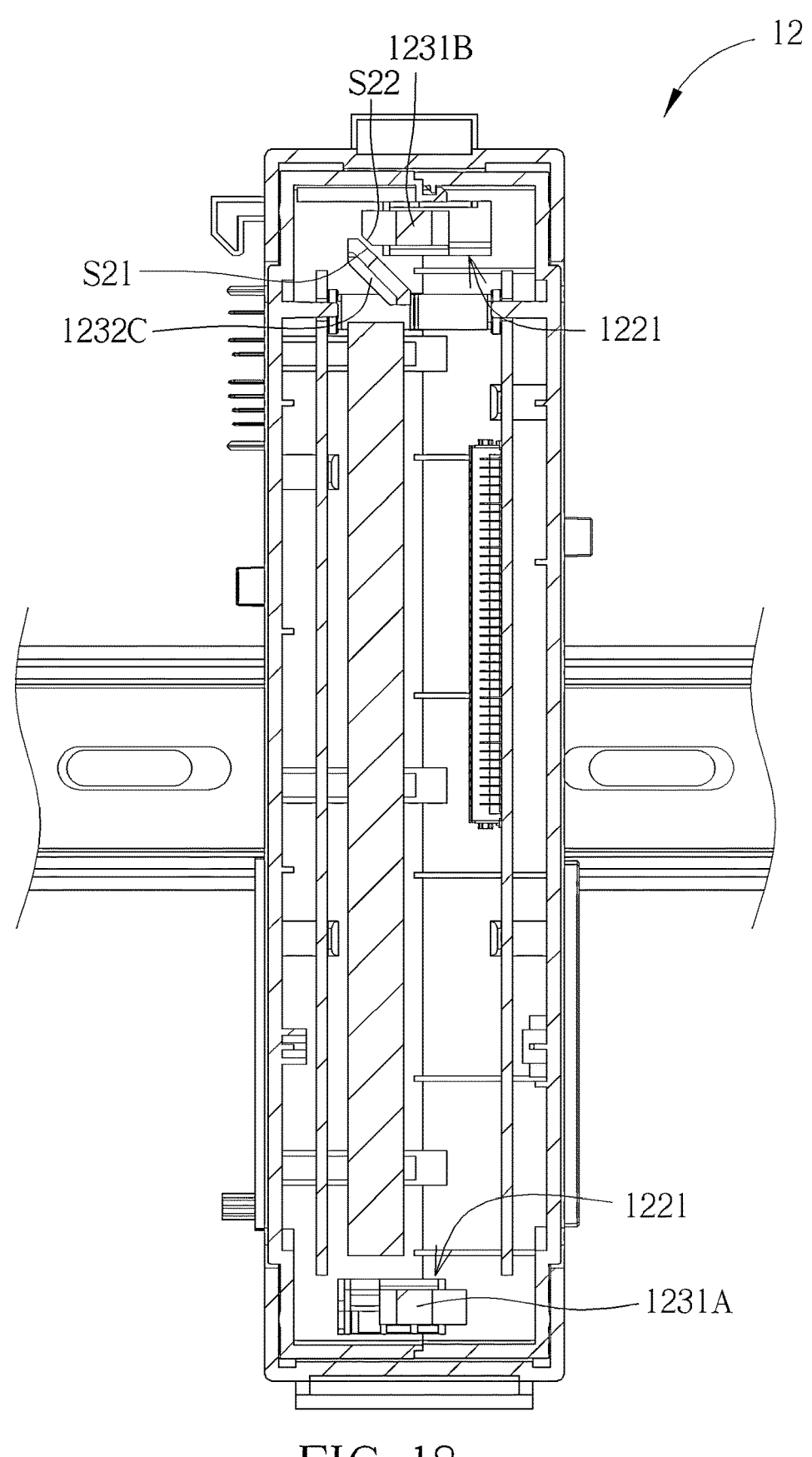
Figure 19:
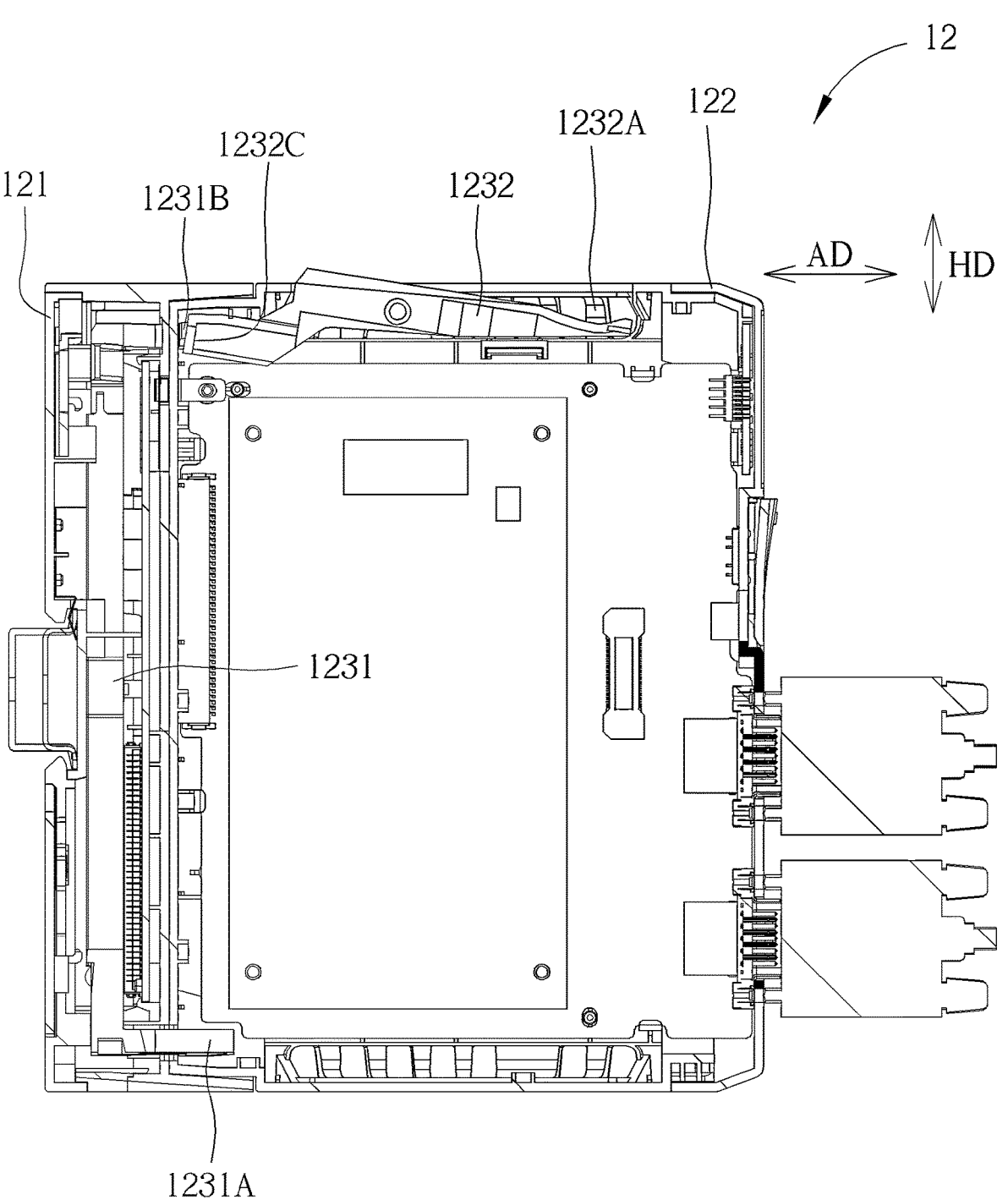
FIG. 19 and FIG. 20 are partial diagrams of the second module of the electronic device at different views as the second latch component is located at a second unlocking position according to the embodiment of the present invention.
Figure 20:
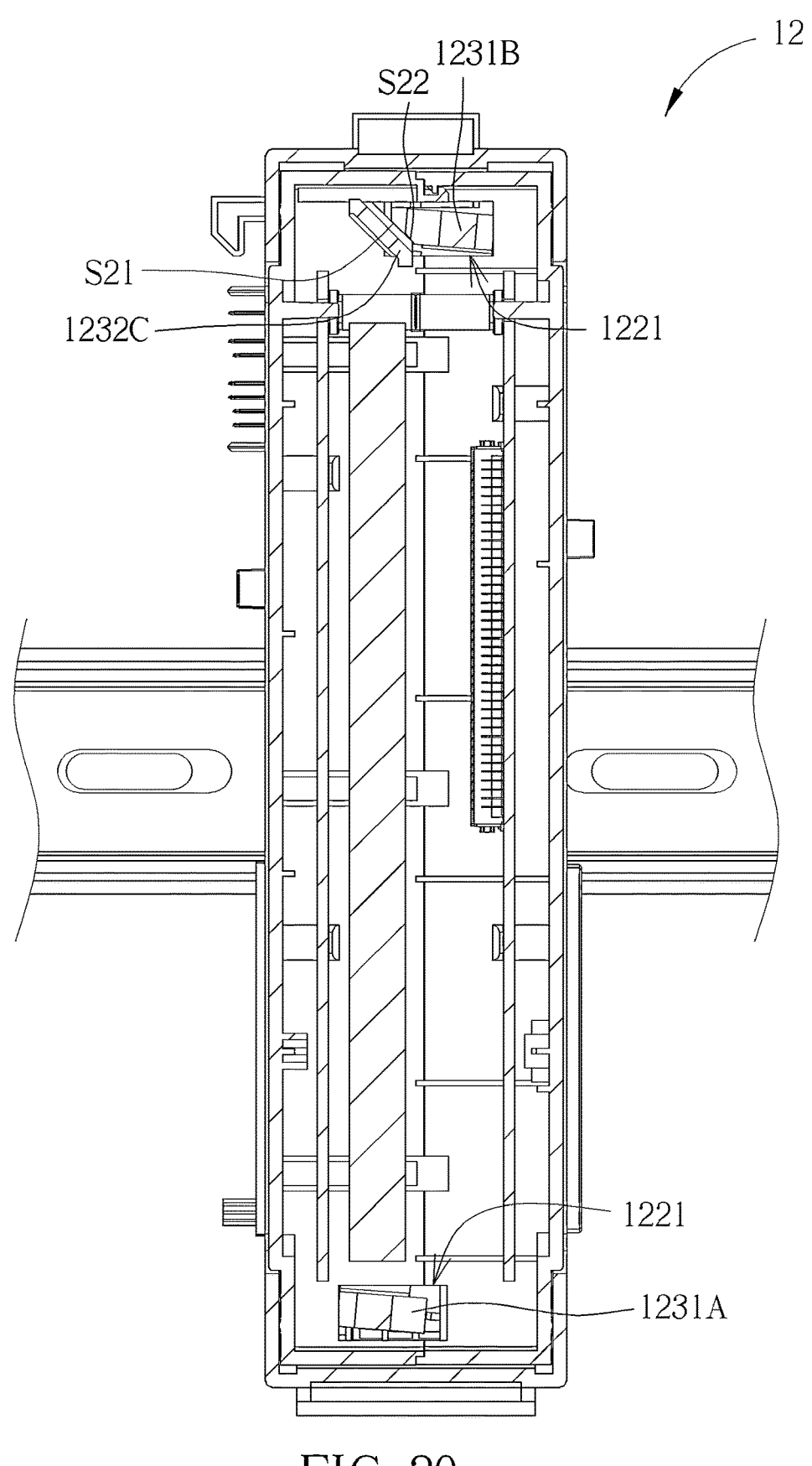

The first locking assembly 113, the second locking assembly 123, the third locking assembly 133 and the fourth locking assembly 143 have the same operational principle. Taking the second locking assembly 123 as an example, detailed description for the second locking assembly 123 is provided as follows. Detailed description for the first locking assembly 113, the third locking assembly 133 and the fourth locking assembly 143 are omitted for simplicity. Please refer to FIG. 17 to FIG. 20. FIG. 17 and FIG. 18 are partial diagrams of the second module 12 of the electronic device 1 at different views as the second latch component 1231 is located at the second locking position according to the embodiment of the present invention. FIG. 19 and FIG. 20 are partial diagrams of the second module 12 of the electronic device 1 at different views as the second latch component 1231 is located at the second unlocking position according to the embodiment of the present invention. When it is desired to detach the second detachable assembly 122 from the second backplane assembly 121, the second operating portion 1232A can be operated to pivot the second operating component 1232 to drive the second latch component 1231 to pivot from the second locking position as shown in FIG. 17 and FIG. 18 to the second unlocking position as shown in FIG. 19 and FIG. 20 by the cooperation of the second driving structure S21 and the second cooperating driving structure S22. When the second latch component 1231 is pivoted to the second unlocking position as shown in FIG. 19 and FIG. 20, the two ends 1231A, 1231B of the second latch component 1231 are disengaged from the two second slots 1221, which allows the detachment of the second detachable assembly 122 from the second backplane assembly 121.

Figure 21:
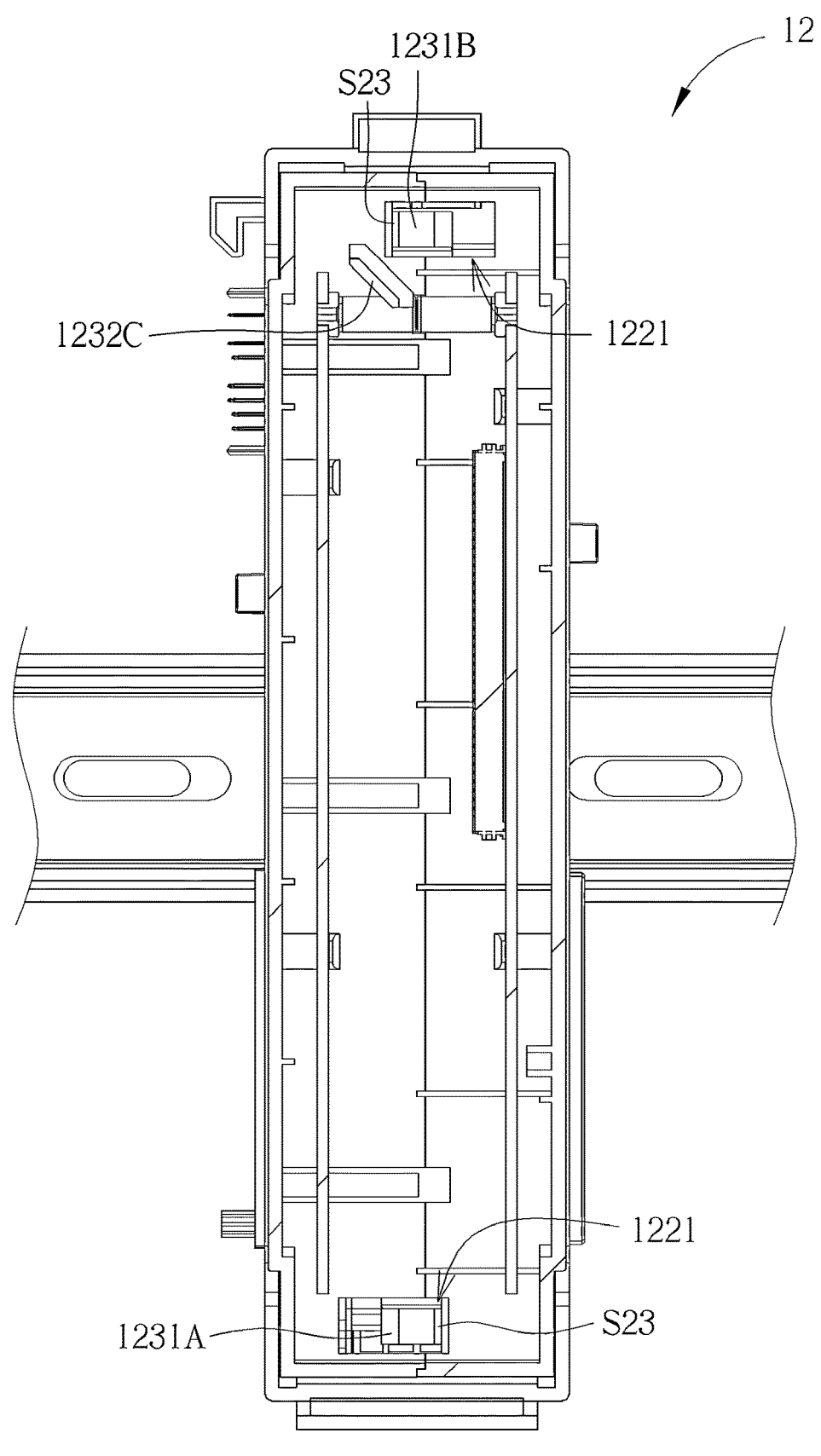
FIG. 21 and FIG. 22 are partial diagrams of the second module of the electronic device at different states during assembly of a second detachable assembly with a second backplane assembly according to the embodiment of the present invention.
Figure 22:
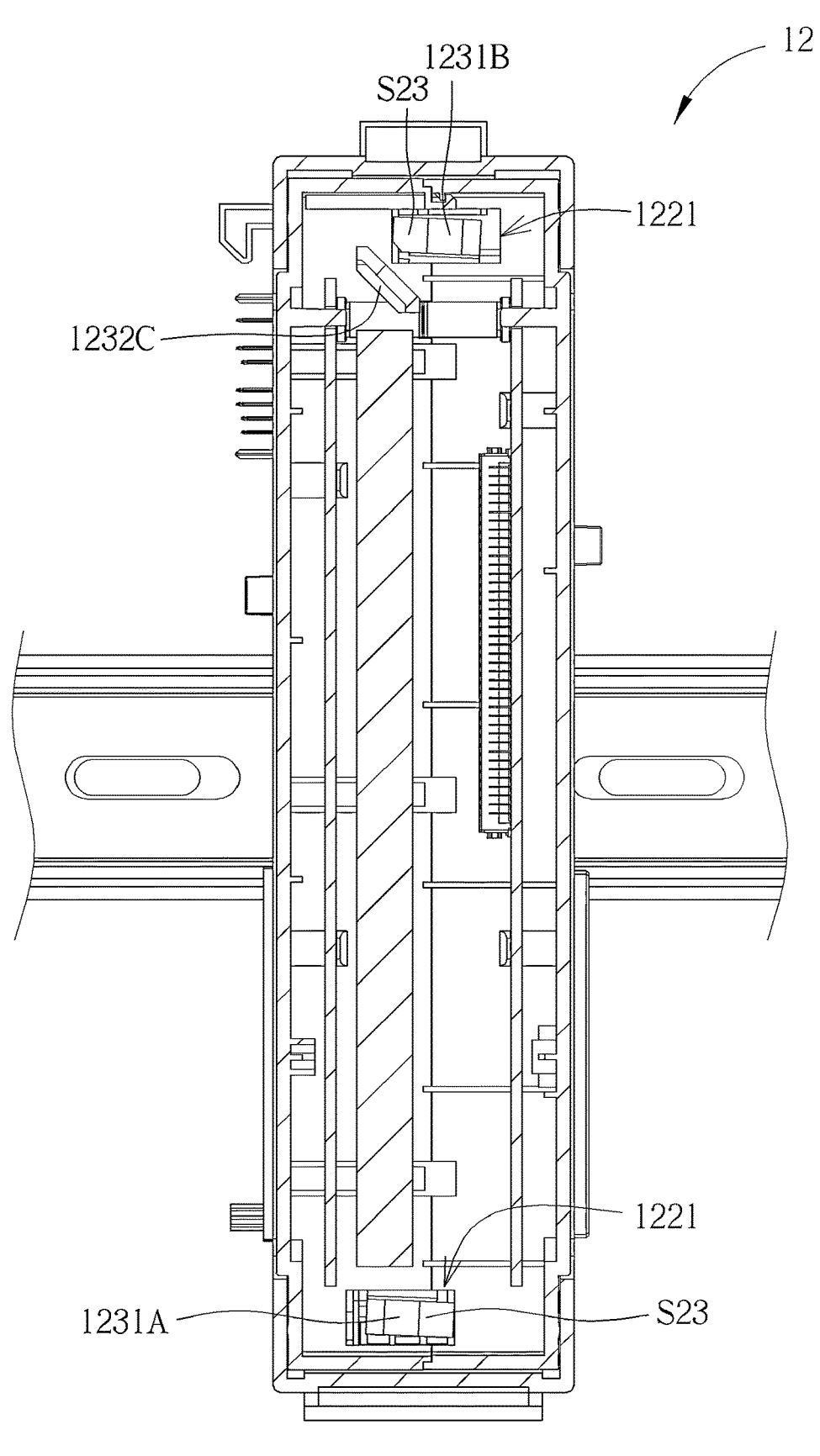

Please refer to FIG. 17, FIG. 18, FIG. 21 and FIG. 22. FIG. 21 and FIG. 22 are partial diagrams of the second module 12 of the electronic device 1 at different states during assembly of the second detachable assembly 122 with the second backplane assembly 121 according to the embodiment of the present invention. As shown in FIG. 21 and FIG. 22, during the assembly of the second detachable assembly 122 with the second backplane assembly 121, due to the abutment of the walls of the second slots 1221 and the second guiding inclined surfaces S23 of the ends 1231A, 1231B of the second latch component 1231, the second latch component 1231 can be driven to pivot to move away from the second locking position for allowing the two ends 1231A, 1231B of the second latch component 1231 to respectively stretch into the two second slots 1221. After the two ends 1231A, 1231B of the second latch component 1231 respectively stretch into the two second slots 1221, the second latch component 1231 can be driven, e.g., by the torsional spring, to move from a position as shown in FIG. 22 to the second locking position as show in FIG. 17 and FIG. 18 to achieve a pivotal engagement of the two ends 1231A, 1231B of the second latch component 1231 and the two second slots 1221, so as to effectively restrain the second detachable assembly 122 from moving relative to the second backplane assembly 121 along the lateral direction, the height direction and a front-rear direction, e.g., an assembling-disassembling direction AD of the second detachable assembly 122 relative to the second backplane assembly 121, so as to prevent the unintentional separation of the second detachable assembly 122 from the second backplane assembly 121 caused by environmental vibration.

Figure 23:
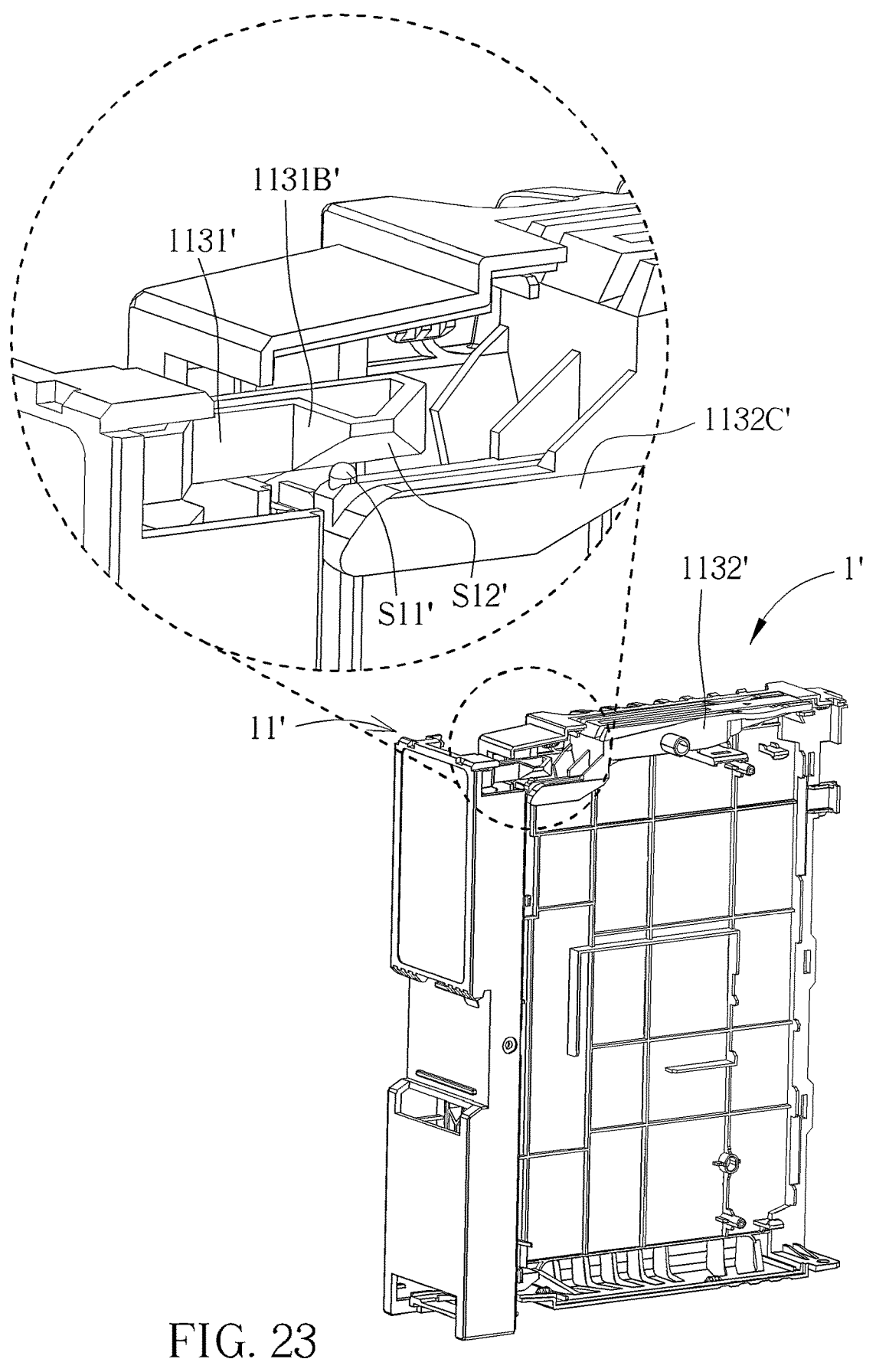
Figure 24:
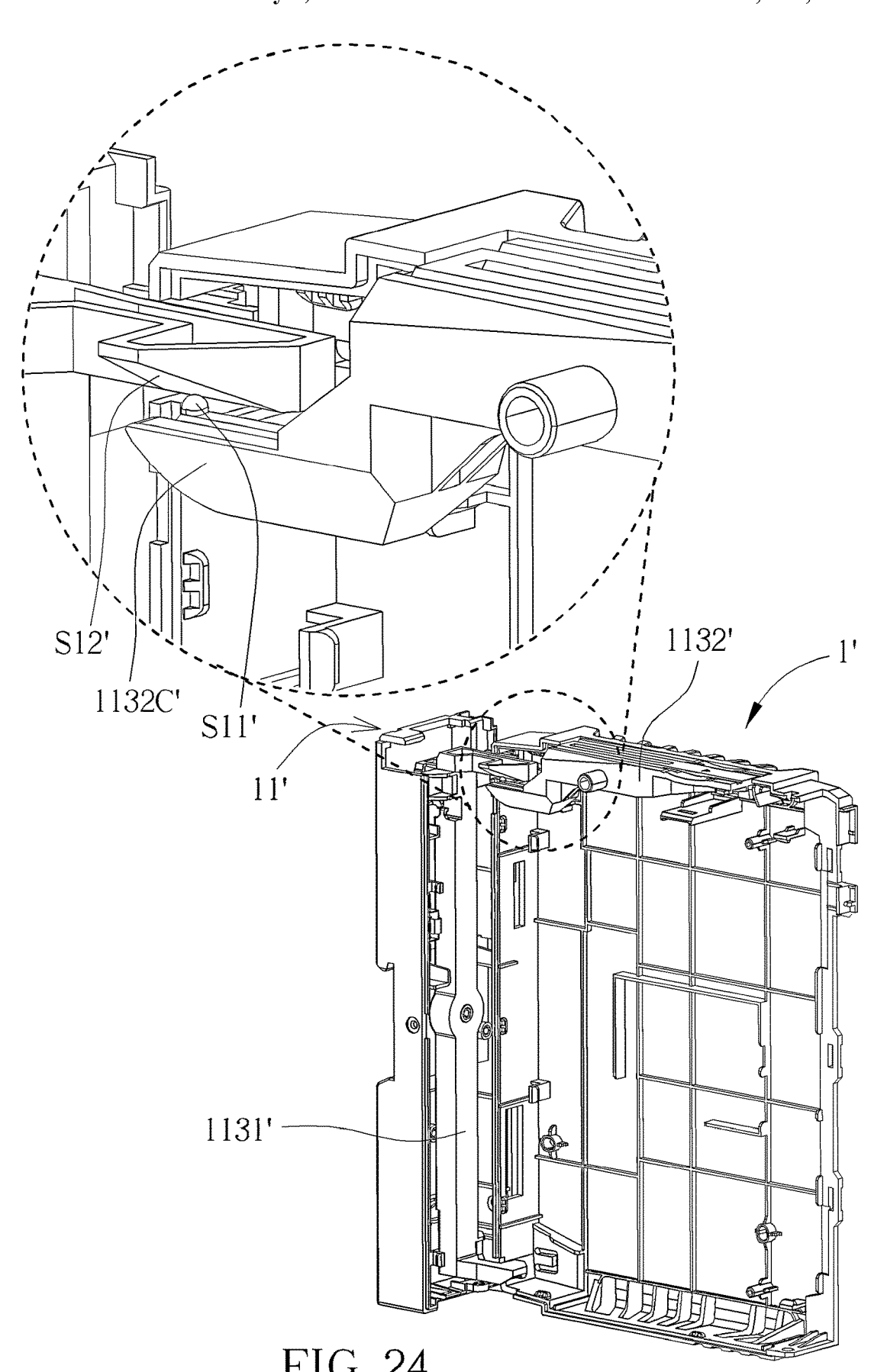

Please further refer to FIG. 23 and FIG. 24. FIG. 23 and FIG. 24 are partial diagrams of a first module 11' of an electronic device 1' at different views according to another embodiment of the present invention. The electronic device 1' of this embodiment is similar to the electronic device 1 of the aforementioned embodiment. As shown in FIG. 23 and FIG. 24, different from the aforementioned embodiment, in this embodiment, a first driving structure S11' formed on a first driving portion 1132C' of a first operating component 1132' can be a protrusion, and a first cooperating driving structure S12' formed on an end 1131B' of a first latch component 1131' can be an inclined surface configured to be abutted by the protrusion to drive the first latch component 1131' to pivot from the first locking position to the first unlocking position. Other details of this embodiment are the same as the ones of the aforementioned embodiment. Detailed description is omitted herein for simplicity.

Besides, understandably, as for the first module of each of the two aforementioned embodiments, the first latch component and the first backplane assembly can be integrated together, so as to be considered as a first backplane assembly kit, and the first operating component and the first detachable assembly can be integrated together, so as to be considered as a first detachable assembly kit. As for the second module of each of the two aforementioned embodiments, the second latch component and the second backplane assembly can be integrated together, so as to be considered as a second backplane assembly kit, and the second operating component and the second detachable assembly can be integrated together, so as to be considered as a second detachable assembly kit. As for the third module of each of the two aforementioned embodiments, the third latch component and the third backplane assembly can be integrated together, so as to be considered as a third backplane assembly kit, and the third operating component and the third detachable assembly can be integrated together, so as to be considered as a third detachable assembly kit. As for the fourth module of each of the two aforementioned embodiments, the fourth latch component and the fourth backplane assembly can be integrated together, so as to be considered as a fourth backplane assembly kit, and the fourth operating component and the fourth detachable assembly can be integrated together, so as to be considered as a fourth detachable assembly kit.

In contrast to the prior art, in the present invention, the latch component is configured to pivotally engage with the slot for restraining the detachable assembly from being detached from the backplane assembly when the latch component is located at the locking position. The aforementioned pivotal engaging configuration can effectively restrain the detachable assembly from moving relative to the backplane assembly along the lateral direction, the height direction and a front-rear direction, e.g., an assembling-disassembling direction of the detachable assembly relative to the backplane assembly, so as to prevent unintentional separation of the detachable assembly and the backplane assembly caused by environmental vibration, i.e., the aforementioned configuration can provide a better sustainability of the environmental vibration. Besides, the second module can be assembled with the first module along the lateral direction, which achieves expandability of the electronic device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A backplane assembly kit comprising:
   a backplane assembly configured to allow a detachable assembly to be mounted thereon; and
   a latch component pivotally disposed on the backplane assembly, at least one end of the latch component being configured to stretch into the detachable assembly through at least one slot formed on the detachable assembly, the at least one end of the latch component engaging with the at least one slot for restraining the detachable assembly from being detached from the backplane assembly when the latch component is located at a locking position;
   wherein a pivoting axis of the latch component is parallel to an assembling-disassembling direction of the detachable assembly relative to the backplane assembly, and the assembling-disassembling direction of the detachable assembly relative to the backplane assembly is perpendicular to a height direction and a lateral direction perpendicular to the height direction.

2. The backplane assembly kit of claim 1, wherein a cooperating driving structure is formed on the at least one end of the latch component and configured to be abutted for driving the latch component to pivot from the locking position to an unlocking position.

3. The backplane assembly kit of claim 1, wherein the backplane assembly comprises a front cover and a rear cover, a portion of the latch component is located between the front cover and the rear cover, at least one through hole is formed on the front cover, and the at least one end of the latch component protrudes out of the front cover through the at least one through hole and stretches into the detachable assembly through the at least one slot.

4. The backplane assembly kit of claim 1, wherein the latch component is biased to pivot to the locking position by a resilient component.

5. The backplane assembly kit of claim 1, wherein the at least one end of the latch component is a hook-shaped structure.

6. A detachable assembly kit comprising:
   a detachable assembly configured to be detachably assembled with a backplane assembly, at least one slot being formed on the detachable assembly; and
   an operating component movably disposed on the detachable assembly and configured to drive a latch component to pivot from a locking position to a unlocking position to disengage at least one end of the latch component from the at least one slot for allowing the detachable assembly to be detached from the backplane assembly, the at least one end of the latch component being configured to stretch into the detachable assembly through the at least one slot formed on the detachable assembly, the at least one end of the latch component engaging with the at least one slot for restraining the detachable assembly from being detached from the backplane assembly when the latch component is located at the locking position;
wherein a pivoting axis of the latch component is parallel to an assembling-disassembling direction of the detachable assembly relative to the backplane assembly, and the assembling-disassembling direction of the detachable assembly relative to the backplane assembly is perpendicular to a height direction and a lateral direction perpendicular to the height direction.

7. The detachable assembly kit of claim 6, wherein the operating component is pivotally disposed on the detachable assembly.

8. The detachable assembly kit of claim 7, wherein a pivoting axis of the operating component is parallel to the lateral direction and perpendicular to the pivoting axis of the latch component.

9. The detachable assembly kit of claim 6, wherein the operating component comprises an operating portion and a driving portion, and the operating portion is operated to move the operating component to drive the latch component to pivot from the locking position to the unlocking position by the driving portion.

10. The detachable assembly kit of claim 9, wherein a driving structure is formed on the driving portion, and the operating component drives the latch component to pivot from the locking position to the unlocking position by a cooperation of the driving structure and a cooperating driving structure formed on the at least one end of the latch component.

11. The detachable assembly kit of claim 6, wherein the operating component is biased to recover by a recovering component.

12. An electronic device comprising:
   a backplane assembly;
   a detachable assembly detachably assembled with the backplane assembly, at least one slot being formed on the detachable assembly; and
   a locking assembly disposed between the backplane assembly and the detachable assembly for locking the detachable assembly on the backplane assembly, the locking assembly comprising:
   a latch component pivotally disposed on the backplane assembly, at least one end of the latch component being configured to stretch into the detachable assembly through the at least one slot, the at least one end of the latch component engaging with the at least one slot for restraining the detachable assembly from being detached from the backplane assembly when the latch component is located at a locking position;
   wherein a pivoting axis of the latch component is parallel to an assembling-disassembling direction of the detachable assembly relative to the backplane assembly, and the assembling-disassembling direction of the detachable assembly relative to the backplane assembly is perpendicular to a height direction and a lateral direction perpendicular to the height direction.

13. The electronic device of claim 12, wherein the locking assembly further comprises an operating component movably disposed on the detachable assembly and configured to drive the latch component to pivot from the locking position to a unlocking position to disengage the at least one end of the latch component from the at least one slot for allowing the detachable assembly to be detached from the backplane assembly.

14. The electronic device of claim 13, wherein the operating component is pivotally disposed on the detachable assembly.

15. The electronic device of claim 14, wherein the pivoting axis of the latch component is different from a pivoting axis of the operating component.

16. The electronic device of claim 15, wherein the pivoting axis of the latch component is perpendicular to the pivoting axis of the operating component.

17. The electronic device of claim 13, wherein the operating component comprises an operating portion and a driving portion, and the operating portion is operated to move the operating component to drive the latch component to pivot from the locking position to the unlocking position by the driving portion.

18. The electronic device of claim 17, wherein a driving structure is formed on the driving portion, a cooperating driving structure is formed on the at least one end of the latch component, and the operating component drives the latch component to pivot from the locking position to the unlocking position by a cooperation of the driving structure and the cooperating driving structure.

19. The electronic device of claim 13, wherein the locking assembly further comprises a resilient component and a recovering component, the resilient component is configured to drive the latch component to pivot to the locking position, and the recovering component is configured to drive the operating component to recover.

20. The electronic device of claim 12, wherein the backplane assembly comprises a front cover and a rear cover, a portion of the latch component is located between the front cover and the rear cover, at least one through hole is formed on the front cover, and the at least one end of the latch component protrudes out of the front cover through the at least one through hole and stretches into the detachable assembly through the at least one slot.

21. The electronic device of claim 12, wherein the locking assembly further comprises a resilient component configured to drive the latch component to pivot to the locking position.

22. The electronic device of claim 12, wherein the at least one end of the latch component is a hook-shaped structure.

* * * * *